United States Patent
Killorn

(10) Patent No.: US 6,265,904 B1
(45) Date of Patent: Jul. 24, 2001

(54) DIGITAL PHASE SHIFT AMPLIFICATION AND DETECTION SYSTEM AND METHOD

(75) Inventor: Ray Killorn, San Jose, CA (US)

(73) Assignee: VLSI Technology Inc., San Jose, CA (US)

(*) Notice: Subject to any disclaimer, the term of this patent is extended or adjusted under 35 U.S.C. 154(b) by 0 days.

(21) Appl. No.: 09/165,415

(22) Filed: Oct. 2, 1998

(51) Int. Cl.⁷ ............................. H03L 7/089; H03K 3/027
(52) U.S. Cl. ................................ 327/12; 327/3; 327/218
(58) Field of Search ............................ 327/3, 7, 12, 165, 327/166, 218, 225, 263

(56) References Cited

U.S. PATENT DOCUMENTS

| | | | |
|---|---|---|---|
| 4,745,302 | * 5/1988 | Kanawa et al. | 327/163 |
| 4,773,085 | * 9/1988 | Cordell | 327/42 |
| 4,797,574 | * 1/1989 | Okubo et al. | 327/144 |
| 4,929,850 | * 5/1990 | Breuninger | 327/198 |
| 5,027,085 | * 6/1991 | DeVito | 327/43 |
| 5,138,189 | * 8/1992 | Leung et al. | 327/198 |
| 5,373,255 | * 12/1994 | Bray et al. | 327/159 |
| 5,668,830 | * 9/1997 | Georgiou et al. | 375/220 |
| 6,128,359 | * 10/2000 | Volk | 327/153 |

* cited by examiner

Primary Examiner—Timothy P. Callahan
Assistant Examiner—Terry L. Englund
(74) Attorney, Agent, or Firm—Wagner, Murabito & Hao LLP

(57) ABSTRACT

A digital phase shift amplification and detection system and method for amplifying and detecting a phase shift. A signal is applied to a digital phase shift amplifier including a flip flop operated in the metastable region in which the applied signal transitions at a relatively close time to a trigger in the clock signal of the flip flop. The digital phase shift amplification and detection system and method amplifies any timing changes in the signal. The amplified signal is fed into a detection circuit configured to detect timing delays in the amplified signal. A signal is applied to a digital phase shift amplifier including a flip flop operated in the metastable region which amplifies any timing changes in the signal. The amplified signal is fed into a detection circuit configured to detect the amplified timing differences in the amplified signal as a result of a relatively smaller timing change in an input signal. The detection circuit is coupled to clock signals that are out of phase with the clock signal that triggers the metastable flip flop in the phase shift amplifier. The amount of phase shift between the clock signals impacts the position of nominal times in the metastable region. In addition, the greater the number of flip flops in the detection circuit that are coupled to clock signals that trigger the flip flop at a different time from any other flip flop in the detection unit, the greater the ability to differentiate and proportional sensitivity the present embodiment has to small timing differences in an input signal.

15 Claims, 19 Drawing Sheets

| SET | CLEAR | OUTPUT |
|---|---|---|
| 1 | 1 | NO CHANGE |
| 0 | 1 | Q = 1 |
| 1 | 0 | Q = 0 |
| 0 | 0 | INVALID* |

*PRODUCES $Q = \overline{Q} = 1$

FIGURE 1B

| PRESET | CLEAR | INPUT PORT | CLOCK | NEW Q |
|---|---|---|---|---|
| 0 | 1 | x | x | 1 |
| 1 | 0 | x | x | 0 |
| 1 | 1 | x | 0 | OLD Q |
| 1 | 1 | 0 | ↑ | 0 |
| 1 | 1 | 1 | ↑ | 1 |
| 0 | 0 | x | x | x |

```
┌─────────────────────────────────────────────────────────────┐
│ APPLY A SIGNAL TO THE INPUT OF A FIRST FLIP FLOP OPERATING IN│
│                  THE METASTABLE REGION.                      │
│                           701                                │
└─────────────────────────────────────────────────────────────┘
                             │
                             ▼
┌─────────────────────────────────────────────────────────────┐
│ TRANSMIT THE OUTPUT OF THE FIRST FLIP FLOP TO A SECOND FLIP  │
│ FLOP THAT HAS A SECOND CLOCK SIGNAL THAT IS OUT OF PHASE     │
│ WITH A FIRST CLOCK SIGNAL APPLIED TO THE FIRST FLIP FLOP.    │
│                           702                                │
└─────────────────────────────────────────────────────────────┘
                             │
                             ▼
┌─────────────────────────────────────────────────────────────┐
│ DETERMINE THE RELATIVE POSITION IN THE METASTABLE REGION OF  │
│         THE SIGNAL APPLIED TO THE INPUT OF                   │
│              THE FIRST FLIP FLOP IN STEP 701.                │
│                           703                                │
└─────────────────────────────────────────────────────────────┘
                             │
                             ▼
┌─────────────────────────────────────────────────────────────┐
│ ESTABLISH IF A TRANSITION OCCURRED IN THE SIGNAL APPLIED TO  │
│         THE FIRST FLIP FLOP IN STEP 701 ABOVE.               │
│                           704                                │
└─────────────────────────────────────────────────────────────┘
                             │
                             ▼
┌─────────────────────────────────────────────────────────────┐
│ INDICATE IF A TRANSITION IN THE SIGNAL APPLIED TO THE FIRST FLIP│
│   FLOP IN STEP 701 ABOVE WENT TO A LOGICAL 1 OR A LOGICAL 0.  │
│                           705                                │
└─────────────────────────────────────────────────────────────┘
```

FIGURE 7

DIGITAL PHASE SHIFT AMPLIFICATION AND DETECTION SYSTEM AND METHOD

FIELD OF THE INVENTION

The present invention relates to the field of signal amplification and detection. More particularly, the present invention relates to a digital phase shift amplification and detection system and method for resolving small periods of time.

BACKGROUND OF THE INVENTION

Electronic systems and circuits have made a significant contribution towards the advancement of modern technology, such as digital computers, calculators, audio devices, video equipment and telephone systems. In particular, electronic technologies are utilized in a number of applications to achieve advantageous results, such as increased productivity and reduced costs in analyzing and communicating data, ideas and trends in most areas of business, science, education and entertainment. It is often necessary for these electronic systems to resolve very small periods of time in order to produce these advantageous results.

Typically, the ability to resolve very small periods of time permits an electronic system to process higher frequency signals. The frequency of signals applied to an electronic system is an operating characteristic that has a significant impact on the functionality the system is capable of providing. The ability to process higher frequency signals usually means an electronic system is able to provide greater throughput and increased intelligence attributes.

In many instances, the applications that require very small periods of time to be resolved pose very significant challenges for most electronic systems and the timing requirements strain their performance capacity. In other instances, reliably resolving the very small periods requires very intricate and sensitive electronic circuits. Such intricate and sensitive electronic circuits are very expensive and in some instances they are an economic impracticality.

Typically, electronic digital circuits are very economic and operate reliably. Modern manufacturing techniques permit transistors (the basic circuit of electrical digital systems) to be constructed in a relatively inexpensive and extremely reliable manner. A transistor configured to operate as a switch consistently produces one of two possible output signal values. Since transistors can dependably generate one of two possible output signal values and because human logic tends to easily comprehend binary states (e.g. on/off, true/false, yes/no, etc.), most digital systems are designed to operate on the basis of discrete values comprising a logical 1 and a logical 0. Usually, the discrete logic values represent information and are manipulated by the circuits of an electronic digital system in a manner that provides solutions to an assortment of problems.

There is a great variety of digital circuit designs available for implementation in electronic circuits. Most electrical digital circuits comprise combinational circuits and sequential circuits. Combinational circuits have output values that are solely dependent on the value present at the inputs at the time the output is measured. However, in sequential circuits, the outputs at any particular time are dependent on both the present value of the inputs and the past history of the system. A common sequential circuit is a circuit referred to as a flip flop.

A flip flop is an example of a relatively inexpensive and extremely reliable electronic digital circuit. Two of the most fundamental flip flops are the NAND gate version and the NOR gate version. As with most digital electronic circuits, the gates are adapted to receive and analyze electrical signals that fall within two distinct ranges. Each of the distinct electrical ranges correspond to logical 1 and logical 0 binary values, which are analyzed in a conventional manner by utilizing Boolean principles. The basic characteristic of most flip flops operating under normal condition is that when certain control signals are applied to the flip flop, it toggles a specific value at an input through to an output in a specific amount of time and maintains ("remembers") that output until a control signal indicates it should change. There are a variety of flip flops types available that operate in accordance with this basic characteristic.

FIG. 1A is a schematic of one embodiment of a NAND gate version flip flop 100. NAND gate version flip flop 100 comprises set port 101, clear port 102, a set NAND gate 103, a clear NAND gate 104, a result port 105 and an inverse port 106. Set NAND gate 103 inputs are coupled to set port 101 and inverse port 106. Set NAND gate 103 output is coupled to result port 105. Clear NAND gate 104 inputs are coupled to clear port 102, and result port 105. Clear NAND gate 104 output is coupled to inverse output 106.

Flip flop 100 operates in accordance with a typical truth table for NAND gate flip flops. The truth table in FIG. 1B illustrates the logical values at result port 105 and inverse port 106 for each of the possible logical values at set port 101 and clear port 102, when flip flop 100 is operated in accordance with manufacturer recommended timing constraints for normal operation. If set port 101 and clear port 102 are logical 1 then there is no change in the logical values at result port 105 and inverse port 106. If set port 101 is changed to a logical 0 value and clear port 102 to a logical 1 value, a short consistent time later, result port 105 will go to a logical 1 value and inverse port 106 will go to a logical 0 value. If set port 101 is switched to a logical 1 value and clear port 102 to a logical 0 value, the same short consistent time later, result port 105 will go to a logical 0 value and inverse port 106 will go to a logical 1 value. The flip flop will not operate properly if both set port 101 and clear port 102 are logical 0 since port 105 and inverse port 106 will both try to go to logical 0 which violates the output definition of flip flop 100 (result port 105 and inverse port 106 should have inverse logical value). Thus, appropriately controlling the inputs of a flip flop produces predetermined digital outputs within a short consistent time after a change in the inputs.

As previously indicated, flip flop 100 is an example of a digital circuit that is economical to manufacture and reliably produces discrete results in accordance with truth table in FIG. 1B when operated under normal conditions. However, when flip flop 100 is operated under normal conditions, its sensitivity to time shifts is determined by its operating characteristics. Most operating characteristics do not permit the resolution of very small time periods under normal operating conditions, for example the small timing differences that are countered when a small phase shift in a signal occurs. In addition, when flip flop 100 is operated under normal conditions, because it is a digital circuit it is not designed to provide many of the beneficial characteristics an analog system can provide.

Accordingly, what is required are economical and reliable digital systems and methods that are able to resolve relatively small time differences in a signal, including those that occur in very small phase shifts. It would be desirable to produce a system that could amplify and detect relatively small timing differences between changes in signals. The system should exhibit quasi analog characteristics and advantageously utilize such quasi analog characteristics. The present invention provides these advantageous functions.

SUMMARY OF THE INVENTION

The present invention is a digital system and method that is able to resolve very small timing differences in a signal, such as those that occur in very small phase shifts. It provides phase shift amplification of a relatively small input phase change to a relatively larger output phase shift. In addition, the present invention utilizes the amplified phase shift to detect differences in the timing of input signals, including small phase shifts. The present invention also exhibits other quasi analog characteristics and advantageously utilizes such quasi analog characteristics.

In one embodiment, the present invention relates to a digital phase shift amplification and detection system and method. A signal is applied to a digital phase shift amplifier including a flip flop operated in the metastable region which amplifies any timing changes in the signal. The amplified phase shift is fed into a detection circuit configured to detect the amplified timing differences in the input signal. The detection circuit is coupled to clock signals that are out of phase with the clock signal that triggers the metastable flip flop in the phase shift amplifier. The amount of phase shift between the clock signals impacts the position of nominal times in the metastable region. In addition, the greater the number of flip flops in the detection circuit that are coupled to clock signals that trigger the flip flop at a different time from any other flip flop in the detection unit, the greater the ability to differentiate and proportional sensitivity the present embodiment has to small timing differences in an input signal.

The present embodiment can be utilized to resolve very small increments of time. The capability of high resolution permits the present embodiment to be implemented in applications that provide an indication if a transition in a signal is at a nominal time, early, or late. It can also be used in applications that adjust a delay lock loop or applications that require fine tuning of a phase lock loop circuit.

DESCRIPTION OF THE DRAWINGS

The accompanying drawings which are incorporated in and form a part of this specification, illustrate embodiments of the invention and together with the description, serve to explain the principles of the invention:

FIG. 1B is a prior art truth table illustrating the logical values at result port 105 and inverse port 106 for each of the possible logical values at set port 101 and clear port 102, when flip flop 100 is operated in accordance with manufacturer recommended timing constraints for normal operation.

FIG. 2C is a truth table illustrating the logical output values when flip flop 210B is operated in accordance with manufacturer recommended timing constraints for normal operation.

FIG. 7 is a flow chart of one embodiment of phase shift amplifying and detection method 700 in which a phase shift in a signal is amplified by a metastable first flip flop and the phase shifts in the signal detected.

BEST MODE FOR CARRYING OUT THE INVENTION

Reference will now be made in detail to the preferred embodiments of the invention, a phase shift amplification and detection system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, circuits, and circuits have not been described in detail as not to unnecessarily obscure aspects of the current invention.

The present invention is a digital system and method that is able to resolve very small time differences in a signal, such as those that occur in very small phase shifts. It can be utilized as a phase amplifier that amplifies a relatively small input phase change to a relatively larger output phase shift. In addition, the present invention can detect the difference in signal timing including small phase shifts. The present invention also exhibits other quasi analog characteristics and advantageously utilizes such quasi analog characteristics.

Figure 1A:
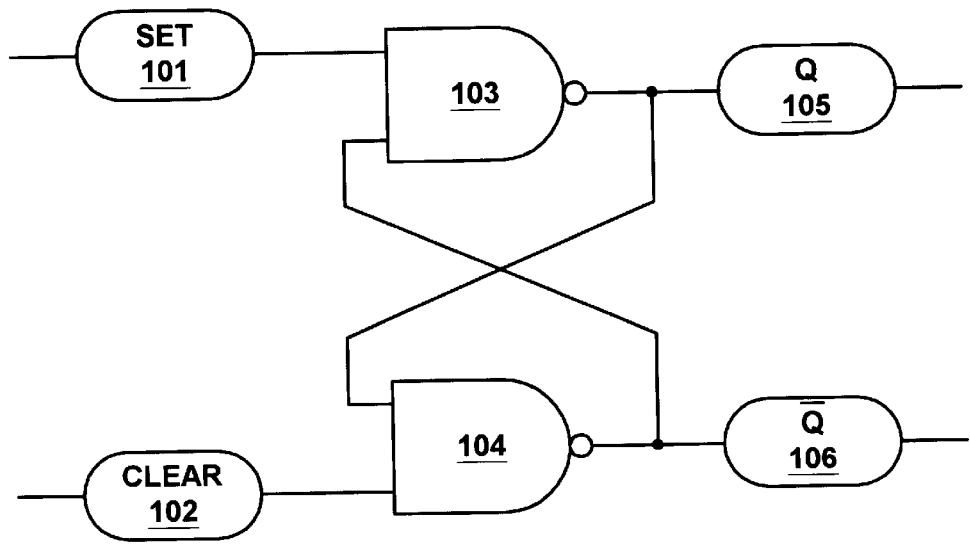
FIG. 1A is a schematic of one embodiment of a prior art NAND gate version flip flop 100.
Figure 2A:
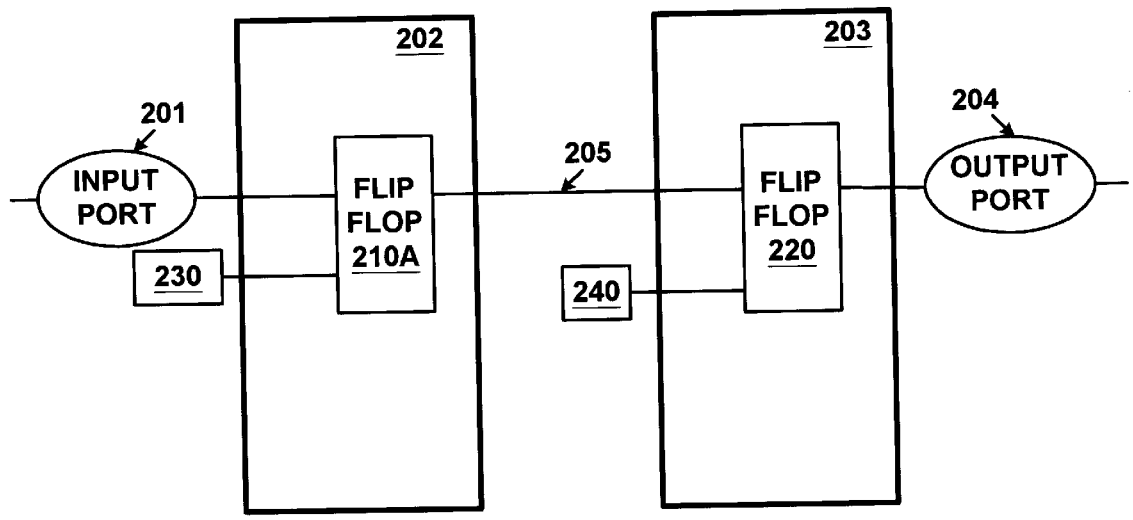
FIG. 2A is a schematic of one embodiment of digital phase shift amplifier and detection system 200A, in accordance with the present invention.

FIG. 2A is a block diagram of one embodiment of a digital phase shift amplifier and detection system 200A. Phase shift amplifier and detection system 200A comprises an input port 201, phase shift amplifier circuit 202, a first clock node 230, a detection circuit 203, a second clock node 240 and an output port 204. Phase shift amplifier 202 comprises a first flip flop 210A and detection circuit 203 comprises a second flip flop 220. Input port 201 is coupled to the input of first flip flop 210A and the output of first flip flop 210A is coupled to the input of second flip flop 220. The output of second flip flop 220 is coupled to output port 204. First clock node 230 is coupled to first flip flop 210A and carries a first clock signal ("first clock signal 230"). Second clock node 240 is coupled to second flip flop 220 and carries a second clock signal ("second clock signal 240"). The first clock signal 230 and second clock signal 240 are out of phase. The input signal at input port 201 is set to transition at a time relative to transitions (triggers) in first clock signal 230, such that first flip flop 210A operates in the metastable region. Second flip flop 220 is configured to sense phase shifts in the output signal of first flip flop 210A and provide status information via output port 204. For example, the status information can indicate adjustments in the input signal at input port 201 are required to ensure first flip flop 210A continues to operate in the metastable region.

Figure 2B:
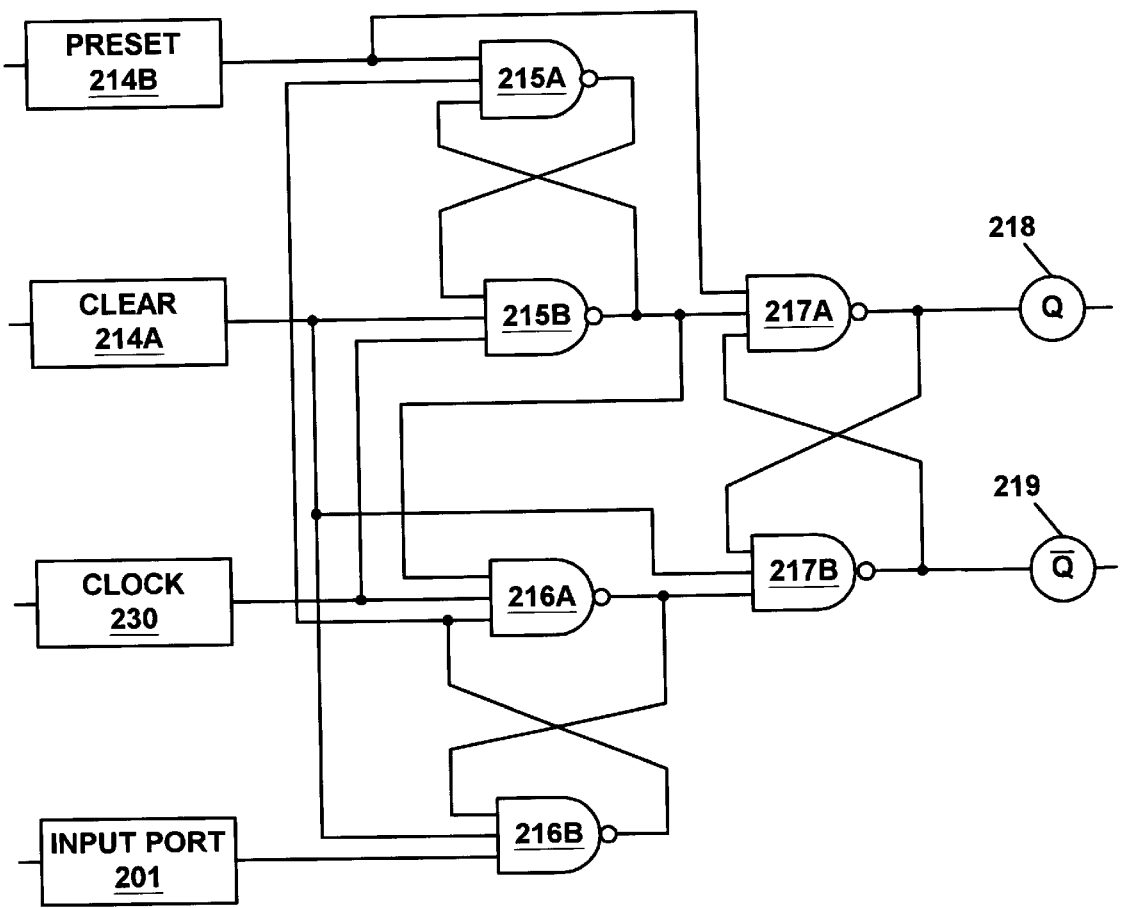
FIG. 2B is a schematic diagram illustrating one embodiment of first flip flop 210A of phase shift amplifier and detection system 200A, based on a clocked D flip flop system 210B.

FIG. 2B is a schematic diagram illustrating one embodiment of first flip flop 210A based on a clocked D flip flop system 210B. Clocked D flip flop system 210B comprises input port 201, first clock node 230, clear port 214A, preset port 214B, preset NAND gate 215A, clear NAND gate 215B, inverse data NAND gate 216A, data NAND gate 216B, data Q NAND gate 217A, inverse Q NAND gate 217B, Q port 218 and inverse Q port 219. Input port 201 is coupled to data NAND gate 216B which is coupled to inverse data NAND gate 216A, preset NAND gate 215A, clear NAND gate 215B and inverse Q NAND gate 217B. First clock node 230 is coupled to clear NAND gate 215B and inverse data NAND gate 216A which are coupled to preset NAND gate 215A, data NAND gate 216B, data Q NAND gate 217A and inverse Q NAND gate 217B. Clear port 214A is coupled to data NAND gate 216B, inverse Q NAND gate 217B and clear NAND gate 215B, which are coupled to preset NAND gate 215A, inverse data NAND gate 216A, and data Q NAND gate 217A. Preset port 214B is coupled to data Q NAND gate 217A and preset NAND gate 215A which is coupled to clear NAND gate 215B, inverse data NAND gate 216A, and data NAND gate 216B. The output of data Q NAND gate 217A is coupled to inverse Q NAND gate 217B and Q port 218. The output of inverse Q NAND gate 217B is coupled to data Q NAND gate 217A and inverse Q port 219.

Clocked D flip flop system 210B produces consistent results in accordance with truth table of FIG. 2C if certain timing parameters are met. Data Q NAND gate 217A and inverse Q NAND gate 217B form a basic NAND gate flip flop referred to as the "output" latch. Preset NAND gate 215A, clear NAND gate 215B, inverse data NAND gate 216A and data NAND gate 216B are referred to as "input" latches and they modify clocked D flip flop system 210B into an edge triggered D flip flop. The signals at clear port 214A and preset port 214B are normally a logical 1 value and are usually only changed to initialize flip flop values before a sequence of clocked operations begin. When the clock signal at first clock node 230 transitions under normal conditions, the logical value at input port 201 is transferred to Q port 218 and the inverse of input port 201 is transferred to inverse Q port 219 in accordance with the truth table in FIG. 2C. In order for the clocked D flip flop system 210A to consistently operate normally and produce outputs in accordance with the truth table of FIG. 2C within a specified time, the signals applied to input port 201 and first clock node 230 must follow specified timing requirements (parameters). Two of the timing parameters are the setup time and the hold time.

Figure 2D:
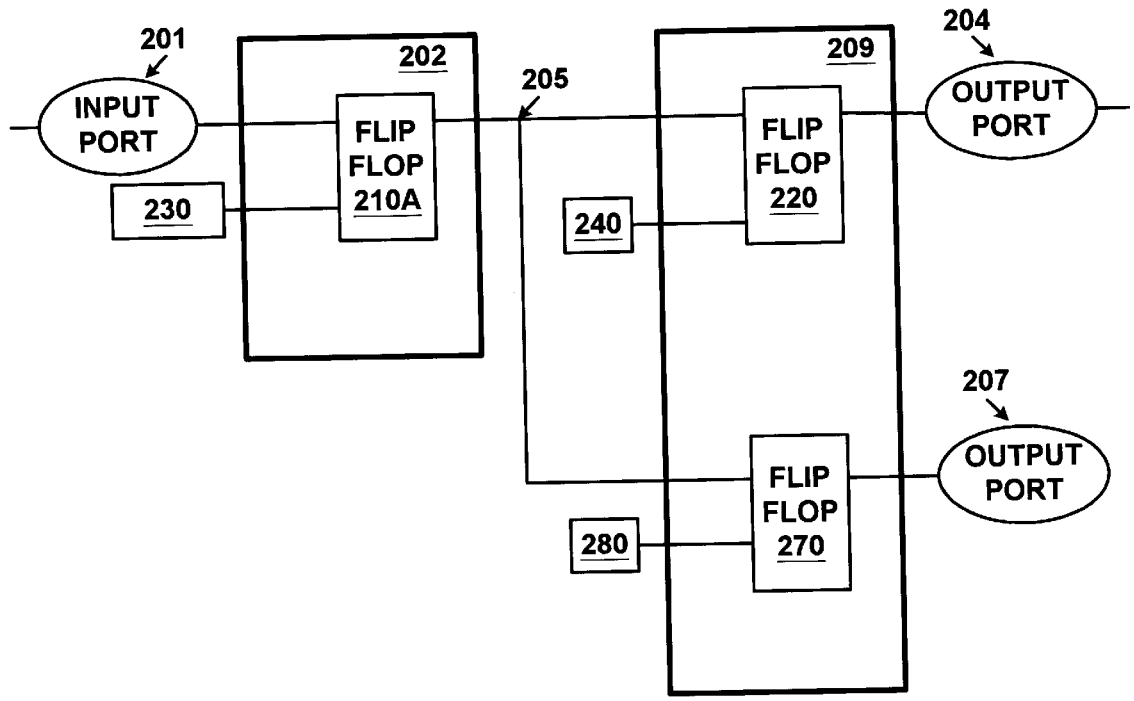
FIG. 2D is a schematic showing digital phase shift amplifier and detection system 200D with two flip flops in detection circuit 209.
Figure 3A:
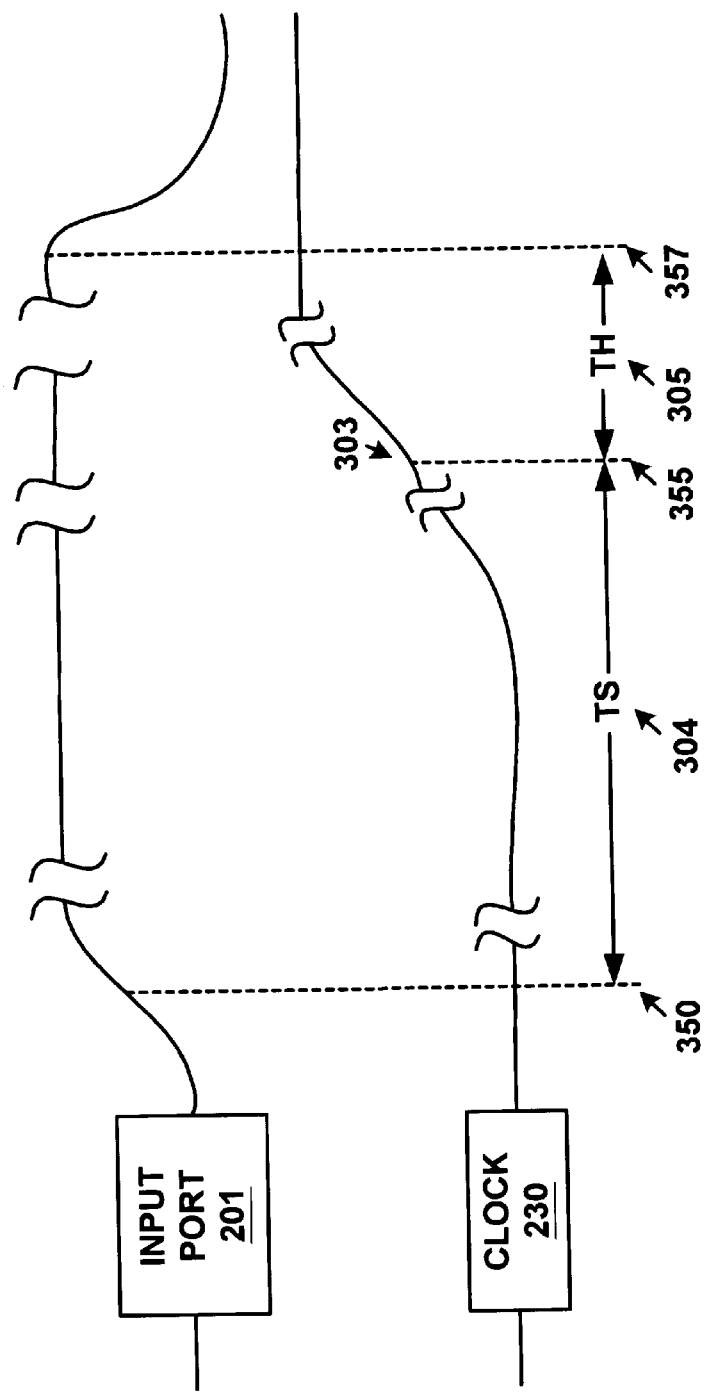
FIG. 3A shows the relationship of the setup time and hold time parameters to a clock transition applied to clocked D flip flop system 210A.

FIG. 3A illustrates the relationship of the setup time and hold time parameters for the present embodiment of clocked D flip flop system 210A. "Data signal 201" is applied to input port 201 and "clock signal 230" is applied a first clock node 230. The setup time (TS) 304 is an interval immediately preceding the active transition 303 of the clock signal 230 that the data signal 201 should be maintained as a logical 1 or logical 0 in order to ensure that the clocked D flip flop 210A operates in a normal fashion. The hold time (TH) 305 is the time interval immediately following the active transition of clock signal 230 that the data signal should be in maintained order to achieve normal operation. The timing interval between minimum setup time and minimum hold time is referred to as the metastable region. If the flip flop is operated in the metastable region it does not consistently produce outputs in accordance with the truth table of FIG. 2D within a specified time.

Figure 3B:
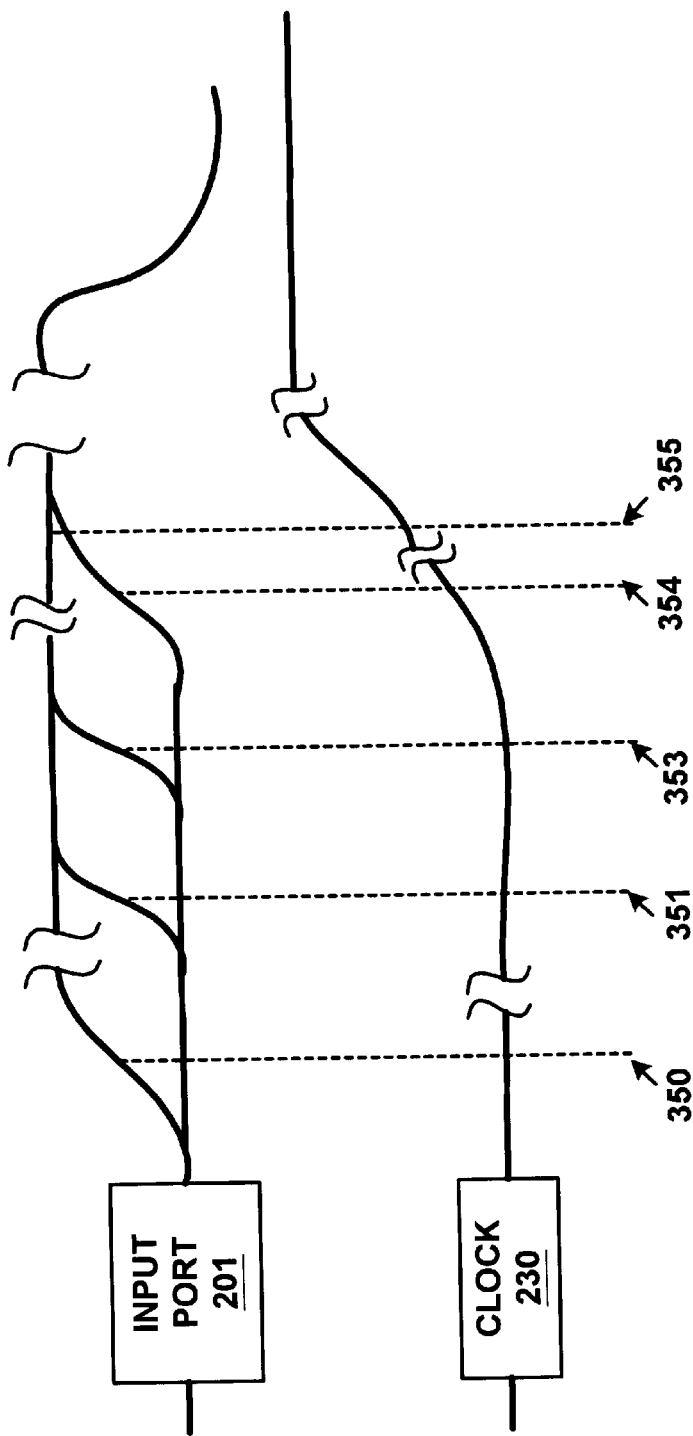
FIG. 3B illustrates the position of different transition times for a data signal 201 applied to clocked D flip flop system 210A, relative to the clock transition time 355 for a clock signal 230.

A flip flop operated in the metastability region displays quasi analog characteristics. The currents normally supplied to the logic drivers' signal paths in the output latches are partially diverted. This division of current increases the propagation time required for an output signal to appear at the output ports of a flip flop. Thus, a flip flop operated in the metastable region produces an output that is delayed (or phase shifted) from the normal output time of a flip flop operating in a normal (non-metastable) region. The delay is dependent on the relative position of the data signal transition to the clock signal in the metastable region. FIG. 3B illustrates the relative position of different transition times in the setup portion of the metastable region. In other embodiments, the hold time requirements of the metastable region are factored into the analysis. The different transition times are shown for a data signal 201 applied to clocked D flip flop system 210A, relative to the clock transition time 355 for a clock signal 230. If the data signal 201 transitions at normal data time 350 or earlier the outputs of the flip flop will consistently produce outputs in accordance with the truth table of FIG. 2C within a specified time. If the data signal 201 transitions at times between normal data time 350 and clock transition time 355, such as early, nominal and late data times 351, 353 and 354 respectively, it will take longer than the specified time for outputs to appear.

Figure 4A:
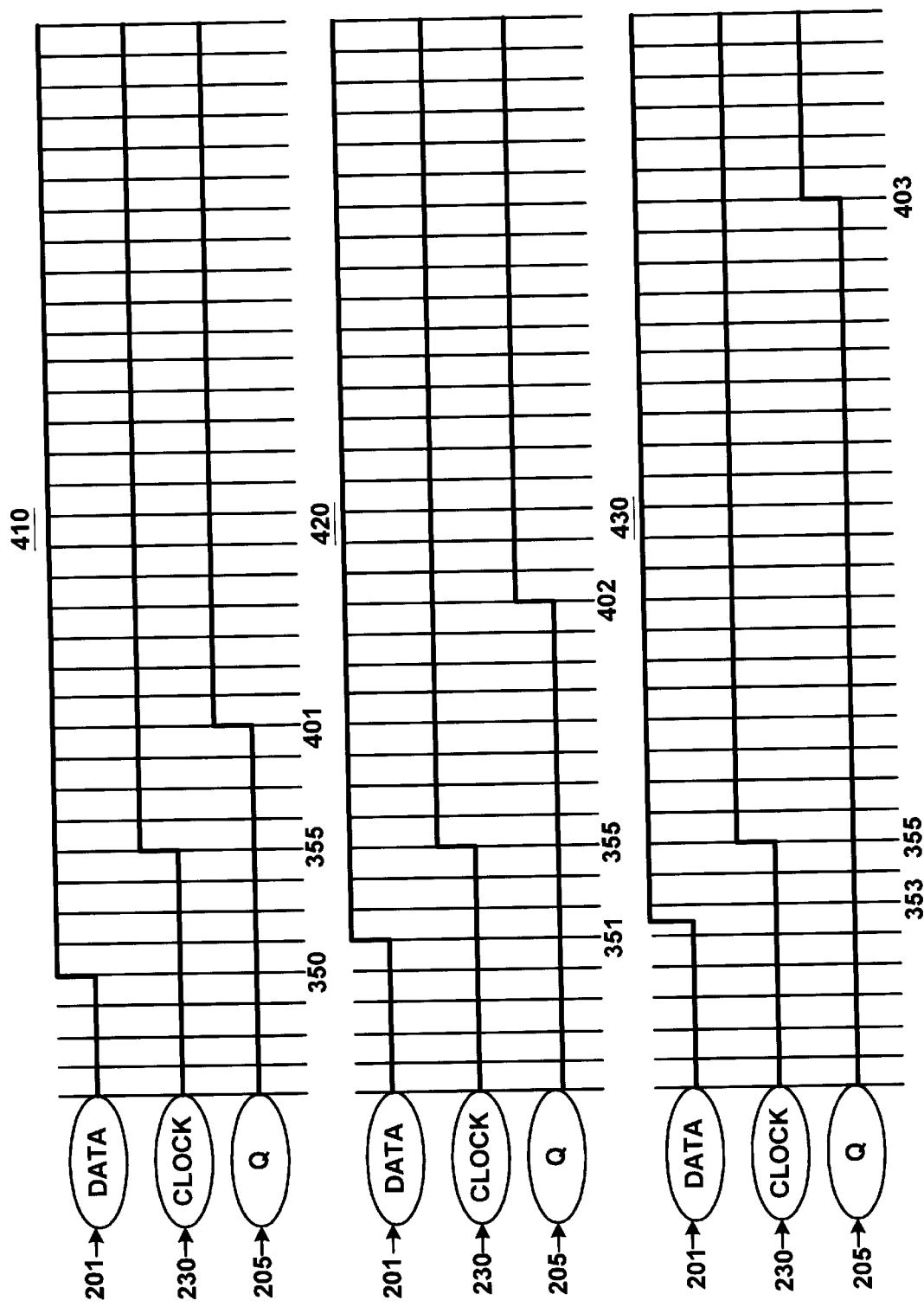
FIG. 4A shows timing diagrams of the increased transition delay in outputs of the clocked D flip flop system 210A and the resulting phase shift in the output signal for one embodiment of the present invention.

FIG. 4A illustrates the increased transition delay in outputs of the clocked D flip flop system 210A and the resulting phase shift in the output signal for one embodiment of the present invention. Transition sequence 410 illustrates that if data signal 201 transitions at normal non-metastable data time 350 and clock signal 230 transitions at clock time 355, output signal Q at node 205 changes polarity at time 401. Transition sequence 420 illustrates that if data signal 201 transitions at early data time 351 and clock signal 230 transitions at clock time 355, output signal 0 at node 205 changes polarity at time 402. It is apparent from FIG. 4 that a small one picosecond phase change in the transition time of data signal 201 from normal data time 350 to early data time 351 results in a phase delay in the output Q at early output time 402 that is 4 picoseconds after normal output time 401. Thus, a one picosecond phase shift in the transition time of data signal 201 results in a phase shift in output Q signal 205 that is four picoseconds, or four times greater.

Timing sequence 430 of FIG. 4A illustrates that another small phase shift closer to the nominal time 353 results in a greater phase shift in data output Q 205. While the phase shift in data signal 201 is again a small shift of two picoseconds to nominal data time 353, it results in phase delay for the output Q signal 205 signal 490 until time 403 that is 17 picoseconds after normal output time 401. Thus small incremental phase shifts in the data signal 201 farther towards metastability results in phase shifts in output Q data that are orders of magnitude greater. In other embodiments, it is possible for the resulting phase shift in the output Q data to increase exponentially and be hundreds of times the phase shift in the input data signal. The present invention recognizes that very small phase shifts in the inputs results in much larger phase shifts in the outputs thereby permitting a number of flexible applications, such as resolving a very small amount of time.

Another characteristic of a flip flop operated in the metastable region that should be taken into consideration is that sometimes the transition at the outputs never occurs in response to a change at the inputs. This results from a number of physical factors such as the previously mentioned division of currents. When a metastable flip flop produces an output in accordance with the truth table, it is referred to as a hit. A miss occurs when the outputs do not transition for a given clock transition. The statistical distribution of getting a hit versus experiencing a miss is dependent on the relative position of the data signal transition to the clock signal in the metastable region. For example, referring again to FIG. 3B, if the data signal 201 transitions between minimum setup time 350 and minimum hold time 357, device behavior is "unspecified" by component vendors.

The outputs of a data flip flop operated in the metastable region follow a distribution that is statistically dependent on the relative transition time of the data signal transition in the metastable region. There is a data transition time in the metastable region that results in a bipolar (equal number) distribution of hits and misses. In the present embodiment, the data transition time that results in an equal number of hits and misses is chosen to be the nominal data transition time. The nominal data transition time 353 is approximately midway into the metastable region (see FIG. 3B). If the data signal 201 statistical average transitions at early data time 351, or late data time 354, the output distribution moves significantly away from an equal distribution of hits and misses. The time difference between early data time 351 and nominal data time 353 is about one picosecond.

As a practical matter, there is an important relationship between the statistical distribution of hits versus misses and the duration of the output delay. As previously discussed, the farther into the metastable region that the data transitions relative to the clock results in much larger delays or phase shifts in the output. However, the statistical probability of resolving tiny phase shifts decreases the farther into the metastable region the data transitions relative to the clock. For example, at early data time 351 there are significantly more hits than misses but the delay in outputs as depicted by timing sequence 420 is smaller than the output delay in timing sequence 430 in which the number of hits equals the number of misses (e.g. when data transitions at nominal time 353). At late data time 354, there are significantly less hits than misses but the output delay is significantly greater than instances where data signal 201 transitions at earlier times (e.g. nominal data time 353). As the transition time for the data moves farther into the metastable region, it will reach a point where probability of producing a miss is 100 percent and a hit is 0 percent.

The relationship between the probability of getting a hit and the length of the output delay should be considered when selecting a particular embodiment of the present invention. As a general proposition, "depth of metastability" should be minimized to avoid the statistically rare condition where internal latch node metastability propagates all the way to the output nodes.

The preferable data signal 201, arbitrarily chosen, is nominal data transition time 353 (see FIG. 3). A statistical distribution centered at nominal data transition time 353 produces an equal number of hits to misses. It is not always necessary to resolve small amounts of phase shift for each data input signal 201 transition, an average of every other data input signal transition is adequate. In addition, the delay in output signal transition is long enough for other digital circuits to recognize and process a transition. In other applications, some digital circuits may require longer data delays in order to sense the delay and thus the data transition time will have to be moved closer to the clock transition time. In still other embodiments, different circuits such as a differently designed phase amplifying flip flop utilizing metastability "hardened" circuits that have different operating characteristics and sensitivities may be used.

As indicated above, in order for a flip flop to produce the delays in the outputs, the flip flop should be operating in the metastable region. Thus, the time between the data input transition and the clock transition falls within the appropriate range. There are a number of ways to accomplish this, for example selecting a clock signal that transitions at an appropriate time relative to the data input signal or vise versa. Alternatively, circuitry that makes appropriate adjustments to the data transition time or clock transition time may be more reliable. For example, the output of digital phase shift amplifier and detection system 200A (FIG. 2A) can be used to provide information to other circuits in a system as well as provide information on the relative location of an input signal in the metastable region. This information on the location of an input signal in the metastable region can be utilized to keep other input signals close to a nominal position and avoid the metastable region of operation.

Refer back to FIG. 2A which shows an embodiment of a digital phase shift amplifier and detection system 200A. The second flip flop 220 is able to detect a phase shift in the input signal since it is triggered by a second clock signal 240 that is out of phase with the first clock signal 230 that triggers flip flop 210A. In this embodiment, the second clock signal 240 is selected so that it transitions at the same time as a transition in the output of first flip flop 210A when its input transitions at the nominal time. Under these conditions, if a transition occurs at the output of first flip flop 210A before the next transition in the second clock signal 240 then any phase shift in the signal at input port 201 is relatively early compared to the nominal time. However, if the output transition of the output of first flip flop 210A does not occur before the next transition in the second clock signal 240 then any phase shift in the signal at input port 201 is relatively late.

Figure 4B:
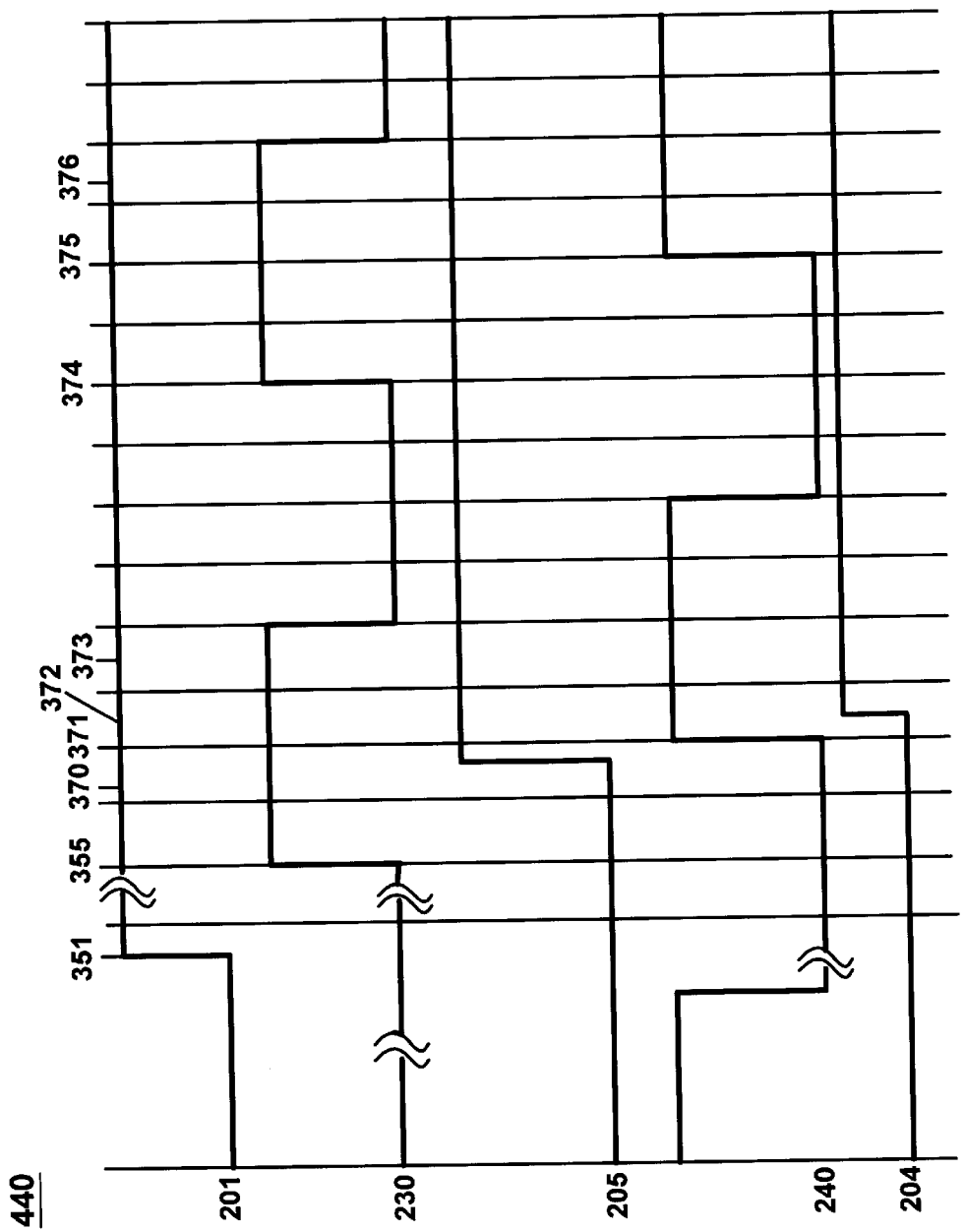
FIG. 4B is a timing diagram 440 showing the logic states of various points in the present embodiment of phase shift amplifier and detection system 200A over a period of time when a data signal 201 transitions "early" relative to a nominal time.
Figure 4C:
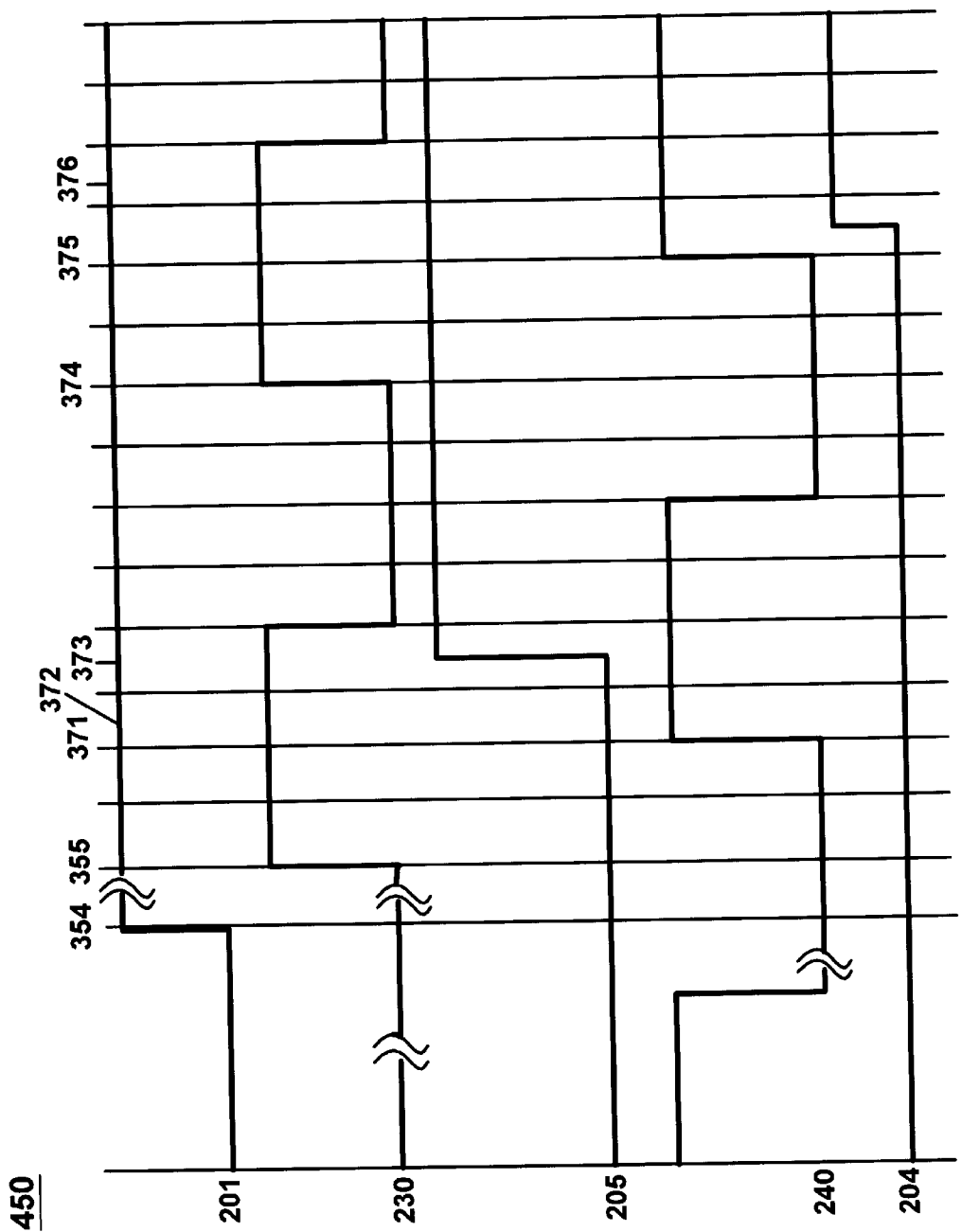
FIG. 4C is a timing diagram 450 showing the logic states of various points in the present embodiment of phase shift amplifier and detection system 200A when the signal at input port 201 is phase shifted relative to its transition time in timing sequence 440 and transitions "late" relative to a nominal time.

FIG. 4B and FIG. 4C show two of the possible timing diagrams for the present embodiment of digital phase shift amplifier and detection system 200A, illustrating the relationship between the output of first flip flop 210A and the second clock signal. FIG. 4B comprises timing sequence 440 showing the logic states of various points in the present embodiment of phase shift amplifier and detection system 200A over a period of time when a data signal 201 transitions early relative to a nominal time. FIG. 4C comprises timing sequence 450 showing the logic states of various points in the present embodiment of phase shift amplifier and detection system 200A when the signal at input port 201 is phase shifted relative to its transition time in timing sequence 440 and transitions late relative to a nominal time.

In timing sequence 440 the signal at input port 201 transitions from a logical 0 to a logical 1 at time 351 which is in the metastable region for first D flip flop 210A. First D flip flop 210A is triggered by first clock signal at time 355 via first clock node 230. The Q output of first D flip flop 210A is delayed and causes the signal at node 205 to transition at time 370. Even though the signal at node 205 is delayed, it transitions sufficiently before the next transition at time 371 in the second clock signal (applied to second clock node 240) to permit the transition to toggle through second D flip flop 220 at time 372 and appear at output port 204.

In timing sequence 450, the signal at input port 201 transitions at time 354, which is further into the metastable region than in timing sequence 440. This causes a significant delay in the Q output of first D flip flop 210A. The delay is long enough to cause the transition at node 205 to occur at time 373 which is later than the transition at time 371 of the second clock signal at second clock node 240. Instead, the transition at node 205 is toggled through second flip flop 220 by the second clock signal via second clock signal port 240 at time 375. The result is a transition at output port node 204 at time 376.

As illustrated in the timing sequence of FIG. 4C, the small phase shift from time 351 to time 354 in the input signal at input port 201 is able to be detected by second flip flop 220 after phase shift amplification because it takes an additional cycle of the second clock signal to toggle the transition through second flip flop 220. If the phase shift in the input signal at input port 201 from time 351 to 354 was applied directly to second flip flop 220 directly, without going through first flip flop 210A, either transition in the input signal at input port 201 would toggle through second flip flop 220 at time 372. Without the phase shift amplification, second flip flop 220 would not be sensitive enough to distinguish between the phase shifted inputs at time 351 and 354.

The phase shift in the signal at output node 204 between time 372 and 376 permits less sensitive circuits to recognize the phase shift. The phase shift from time 372 to 376 in the output signal at output node 204 is approximately twenty four times larger than the phase shift from time 351 to 354 in the input signal at input port 201. For example, another circuit of a system (not shown in FIG. 2B) is not sensitive enough to directly sense the small phase shift between times 351 and 354. However, the other circuit of the unshown system does have logic that can sense the phase shift from 372 to 376 in the output signal at output port 204 and by extrapolation can detect the phase shift from 351 to 354 in the input signal at input port 201. Similarly, other circuits (not shown) that can not recognize the phase shift in a signal at input port 201 from 351 to 354 are able to detect the phase shift in the output at node 205 from time 370 to time 372, and again by extrapolation can detect the phase shift in the signal at input port 201.

In the present embodiment, the transition times of the second clock signal determines the nominal time. When the input signal at input signal port 201 transitions at the nominal time the transition at node 205 occurs at the same time as a transition in the second clock signal. Given this definition of the nominal time, the relative timing of a transition in a signal at node 205 to a transition in the second clock signal indicates whether the transition at input 201 was earlier or later than the nominal time.

Referring now to FIG. 2D which shows phase shift amplifier and detection system 200D, another embodiment of phase shift amplifier and detection system 200A. Phase shift amplifier and detection system 200D is similar to phase shift amplifier and detection system 200A, except detection circuit 209 includes a third flip flop 270. Third flip flop 270 is coupled to the output of first flip flop 210A and to output port 207. Third flip flop 270 is also coupled to a third clock signal at third clock node 280. The addition of flip flops to detection circuit 209, such as third flip flop 270, permits a more proportional resolution of smaller and/or multiple time increments in the metastable region.

Figure 4D:
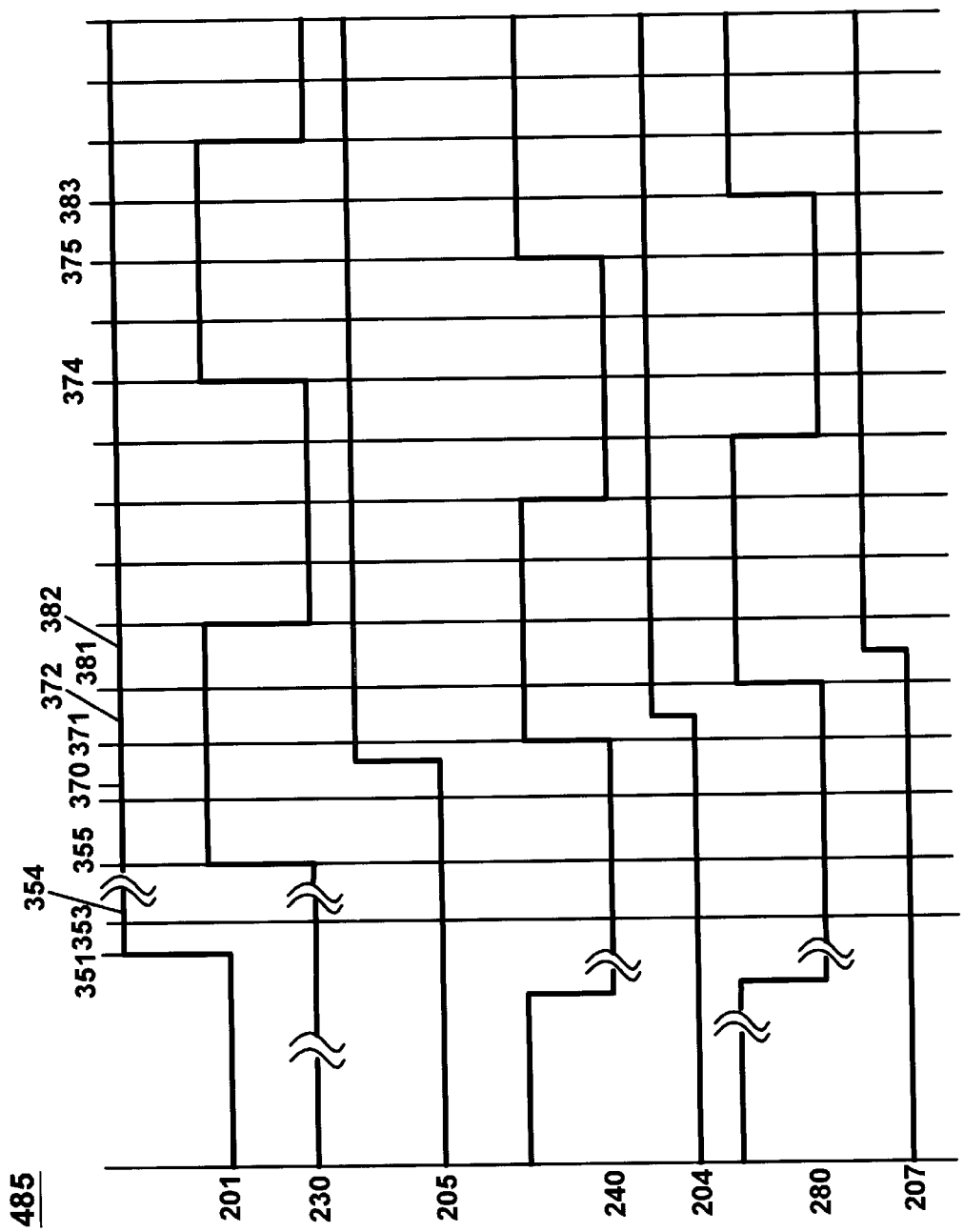
FIG. 4D is timing diagram 485 showing the logic states of various points in phase shift amplifier and detection system 200D when an input data signal transitions in a relatively "early" time period.
Figure 4E:
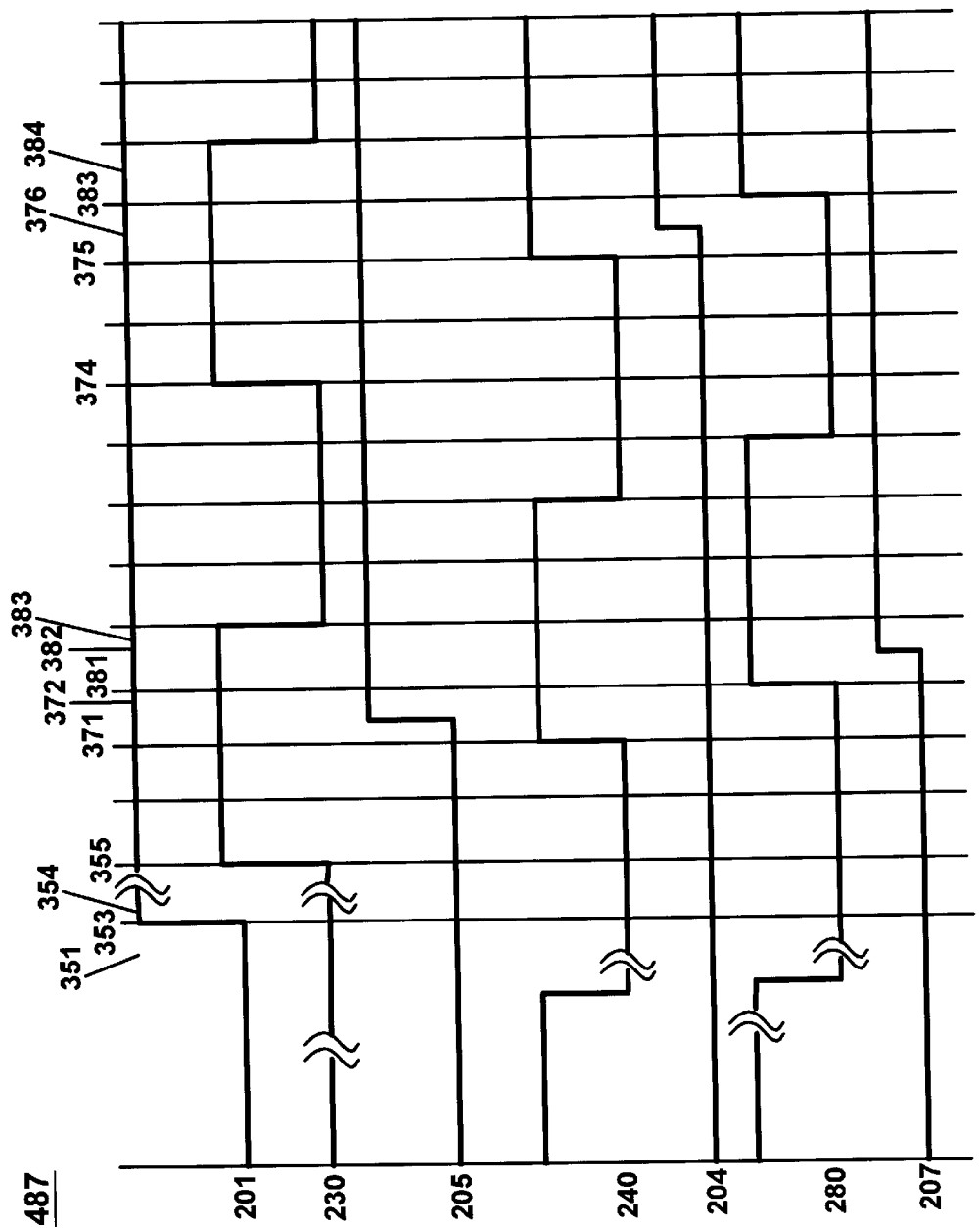
FIG. 4E is timing diagram 487 showing the logic states of various points in phase shift amplifier and detection system 200D when an input data signal transitions in a "nominal" time period.
Figure 4F:
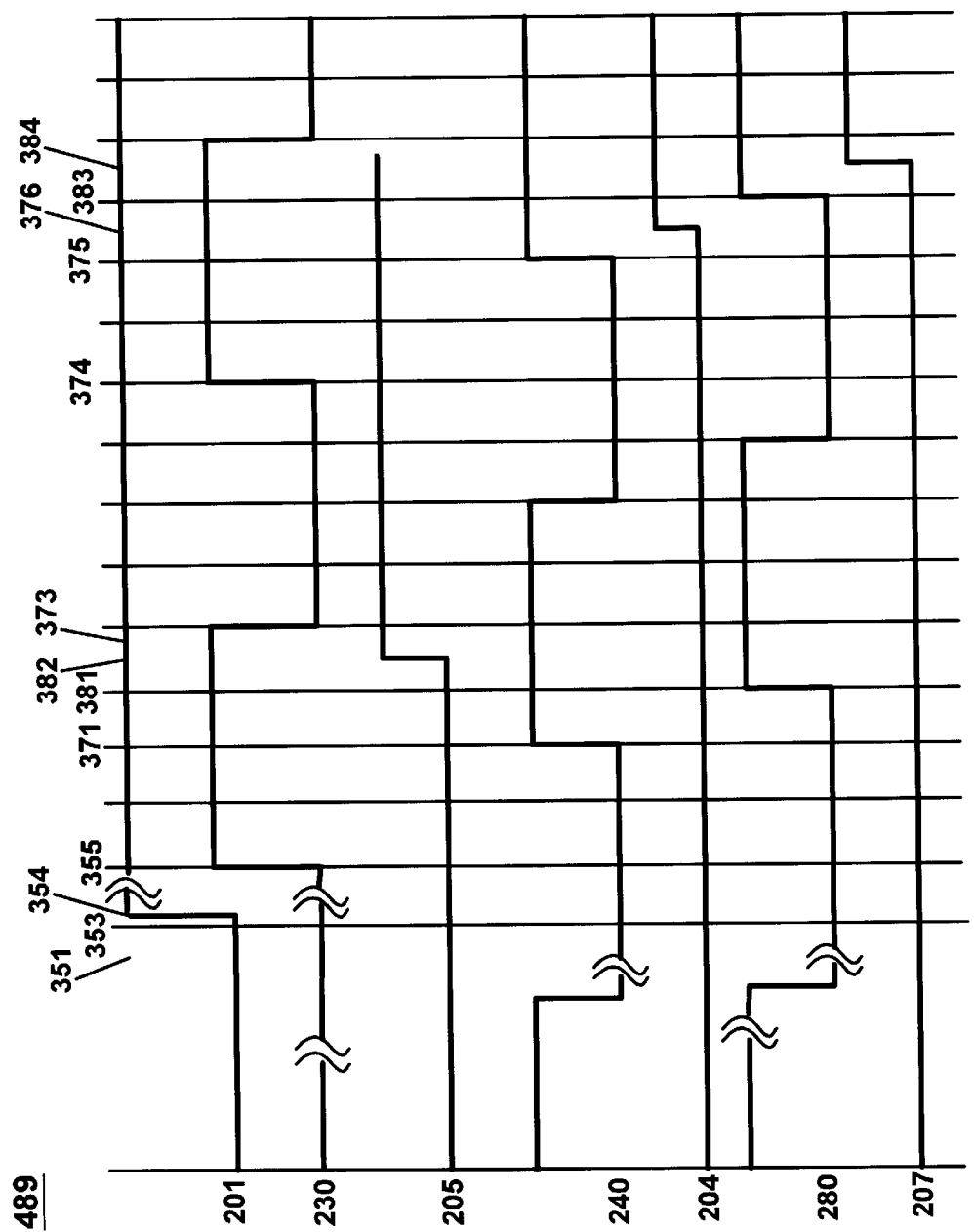
FIG. 4F is timing diagram 489 showing the logic states of various points in phase shift amplifier and detection system 200D when an input data signal transitions in a relatively "late" time period.

FIG. 4D, 4E and 4F are illustrations of possible timing diagrams for the present embodiment of phase shift amplifier and detection system 200D. FIG. 4D comprises timing sequence 485 showing the logic states of various points in phase shift amplifier and detection system 200D when an input data signal transitions in a relatively "early" time period. FIG. 4E comprises timing sequence 487 showing the logic states of various points in phase shift amplifier and detection system 200D when an input data signal transitions in a "nominal" time period. FIG. 4F comprises timing sequence 489 showing the logic states of various points in phase shift amplifier and detection system 200D when an input data signal transitions in a relatively "late" time period.

Timing sequence 485 of FIG. 4D is the same as timing sequence 440 in FIG. 4B, except timing sequence 485 also illustrates the transitions related to third flip flop 270. The transition in the signal applied to node 205 at time 370 is early enough to catch the transition in the third clock signal via the third clock node 280 at time 381. Thus at time 382 the signal at data output port 204 and data output port 207 are both a logical 1 indicating the signal transition at time 351 in the signal applied to the first flip flop 210A was early.

Timing sequence 487 shown in FIG. 4E illustrates an example of the value of transitions in the present embodiment of phase shift amplifier and detection system 200D (FIG. 2D) when a signal at input port 201 transition during a nominal period. The transition in the signal applied to node 205 at time 353 is slightly later than the transition in timing scheme 485 at time 351. The transition in the signal at node 205 results is delayed until time 372. This delay is long enough for the transition at node 205 to miss the transition in the second clock signal via second clock signal node 240 at time 371. However, the transition at time 372 in node 205 is early enough to catch the transition in the third clock signal via the third clock node 280 at time 381. Thus at time 382, the signal at data output port 204 is a logical 0 and at data output port 207 the value is a logical 1. This condition indicates that the signal transition at time 353 in the signal applied to the first flip flop 210A is within a very small nominal time window. As a practical matter, the nominal time window is so small that the signal transition resolution far exceeds normal resolutions for a given technology.

FIG. 4 F illustrates timing sequence 489 of phase shift amplifier and detection system 200D. In timing sequence 489 the transition in the signal at input port 201 occurs at time 354. The sequence of transitions at input port 201, node 205, second clock node 240 and output port 204 would be the same as timing sequence 450 in FIG. 4C. The transition of the signal in node 205 at time 373 is to late to catch the transition in the third clock signal via third clock node 280 at time 382. Thus at time 382 the signals at data output port 204 and data output port 207 are both a logical 0 indicating the signal transition at time 354 in the signal applied to the first flip flop 210A was late.

Figure 5A:
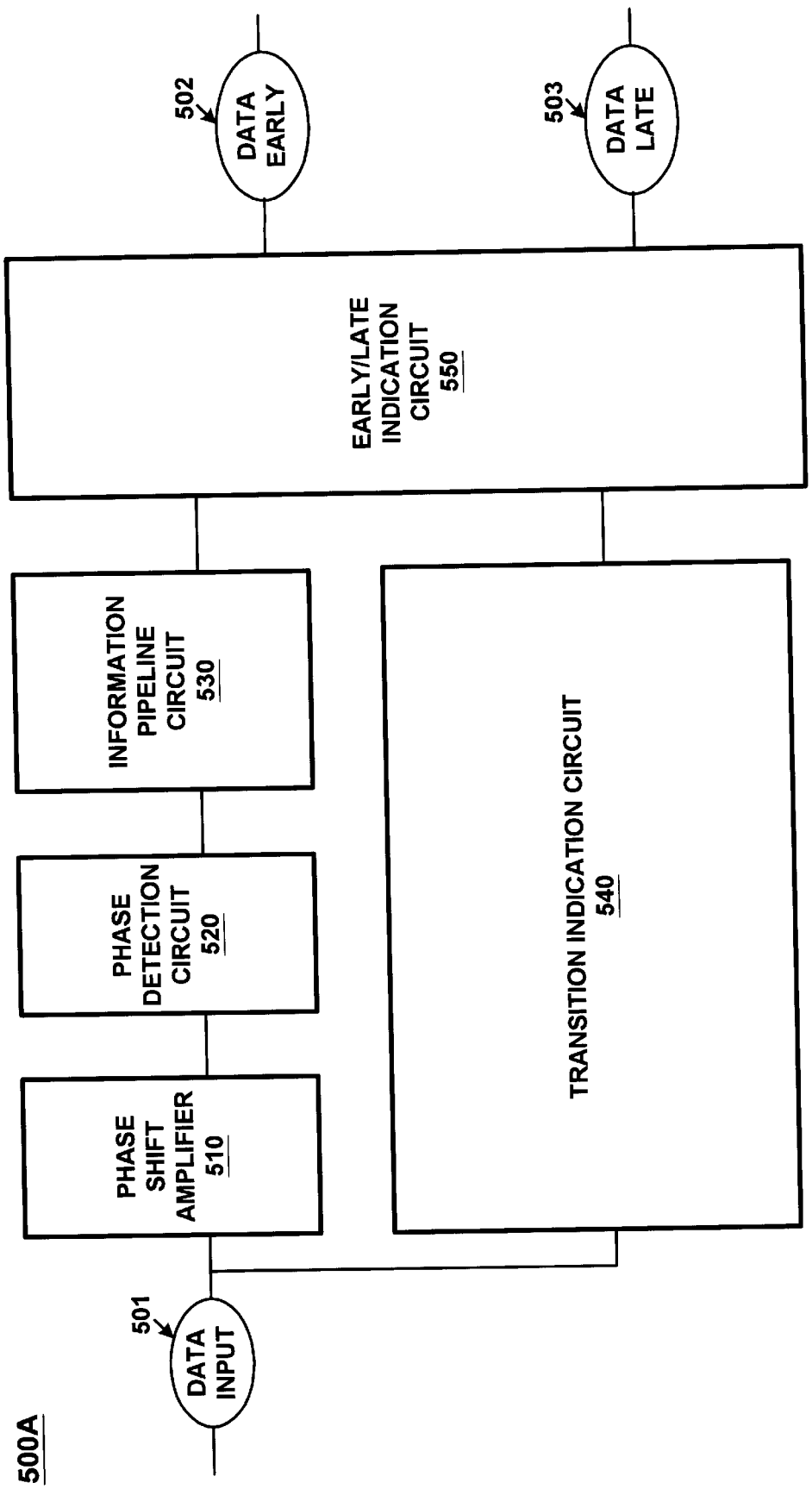
FIG. 5A shows a block diagram of an embodiment of a digital phase amplifier and detector system 500A that includes a transition indication circuit and early/late indication circuit.

FIG. 5A shows a block diagram of an embodiment of a digital phase amplifier and detector system 500A. Digital phase amplifier and detector system 500A comprises a data input port 501, a phase amplifier circuit 510, a phase detection circuit 520, an information pipeline circuit 530, a transition indication circuit 540, an early/late indication circuit 550, a data early output port 502 and data late output port 503. Data input port 501 is coupled to phase amplifier circuit 510 and transition indication circuit 540. Phase amplifier circuit 510 is coupled to phase detector 520 which is coupled to information pipeline 530. Early/late indication circuit 550 is coupled to information pipeline circuit 530, transition indication circuit 540, data early output port 502 and data late output port 503.

Phase amplifier and detector system 500A amplifies a phase shift and detects that the phase shift occurred. A data signal at data input port 501 is sent to phase amplifier circuit 510 and transition indicator 540. Phase amplifier circuit 510 amplifies phase shifts in the data signal. Phase detection circuit 520 detects the phase shift. Information pipeline circuit 530 provides a timing correction mechanism to equalize delay due to transmission through transition indicator 540. Transition indication circuit 540 indicates if there has been a transition in the polarity of the data signal. Early/late indication circuit 550 indicates if the detected phase shift in the transition of the data signal was towards an earlier data transition time or a later data transition time. If the phase shift was towards an early data transition time, a data early signal is transmitted through data early output 502 indicating the data transition time was early. If the phase shift was towards a late data transition time, a data late signal is transmitted through data late output 502 indicating the data transition time was late. If the signals at data early output 502 and data late output 502 do not indicate the signal was late or early, an indication that it was on time can be extrapolated. The data early signal and data late signal can be utilized for a number of purposes, for example maintaining a phase amplifier in the metastable region.

Figure 5B:
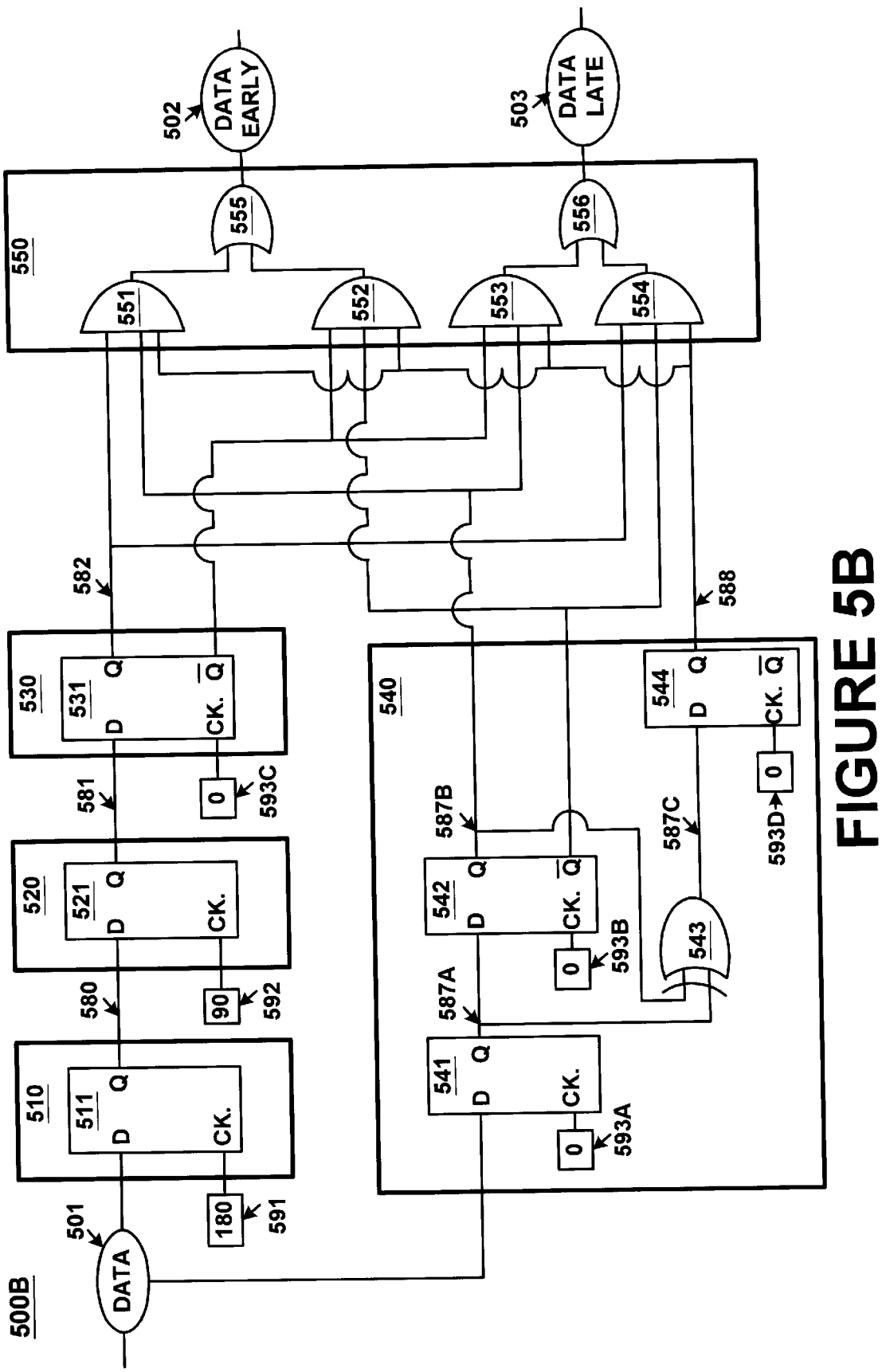
FIG. 5B is a schematic of one embodiment of a digital phase amplifier and detector system 500A that illustrates the circuitry of one embodiment of a transition indication circuit and early/late indication circuit.

FIG. 5B is a schematic of one embodiment of digital phase amplifier and detector system 500A. Phase amplifier circuit 510 comprises a first D flip flop 511. Phase detector circuit 520 includes a second D flip flop 521. Information pipeline 530 comprises a third D flip flop 531. Transition indication circuit 540 includes a fourth D flip flop 541, a fifth D flip flop 542, a sixth D flip flop 544 and an exclusive OR gate 543. Early/late indication circuit 550 includes a first, second, third and fourth AND gates 551, 552 553 and 554 respectively, a first OR gate 555 and a second OR gate 556. All the D flip flops are triggered by positive going edges in their respective clock signals.

Phase amplifier 510 amplifies a phase shift in the signal on data input port 501. Data input port 501 is coupled to the D input of first D flip flop 511 which is operated in the metastable region. The clock input port of first D flip flop 511 is coupled to a clock input port 591 which carries a first clock signal that is 180 degrees out of phase with a 0 degree clock reference signal. The Q output of first D flip flop 511 is delayed since it is operating in the metastable region.

Phase detection circuit 520 detects phase shifts in the signal at the D input of second flip flop 521. The D input of second flip flop 521 is coupled to the Q output of first D flip flop 511. The clock input port of second D flip flop 521 is coupled to a clock input port 592 which carries a second clock signal that is 90 degrees out of phase with a 0 degree clock reference signal.

Still referring to FIG. 5B, transition indication circuit 540 detects if the signal at data input port 501 has switched from a logical 0 to a logical 1 or vice versa. At any given time, a switch in the signal at data input port 501 is referred to as the relevant transition. The D input of fourth D flip flop 541 is coupled to data input port 501. The Q output of fourth D flip flop 541 is coupled to an input of exclusive OR gate 543 and to the D input of fifth D flip flop 542. The Q output of fifth D flip flop 542 is coupled to another input of exclusive OR gate 543 and early/late indication circuit 550. Both fourth D flip flop 541 and fifth D flip flop 542 are triggered by a third clock signal that is a 0 degree clock reference signal. Thus, a positive going edge of 0 degree clock reference signal causes the logical polarity at node 587A to be the same as the relevant transition and the logical polarity at node 587B to be the same as the polarity of a signal that was at data input port 501 previous to the relevant transition.

The logical values at nodes 587A and 587B are fed into the inputs of XOR gate 543. Thus, if the logical values at nodes 587A and 587B are not the same it indicates there was a relevant transition in the signal at data input port 501 and the output of XOR gate 543 is a logical 1. When there is no relevant transition in the signal at data input port 501, the output of exclusive OR gate 543 is a logical 0. The output of XOR gate 543 is coupled to the D input of sixth D flip flop 544. Sixth flip flop 544 is utilized to synchronize the output of XOR gate 543 indicating there was a relevant transition and the output of fifth D flip flop 542 thereby indicating what the logical value is valid. In order to accomplish this synchronization, sixth D flip flop 544 toggles the output of exclusive OR gate 543 at a trigger time that is one cycle after the 0 degree clock reference signal that toggled the relevant transition through fourth D flip flop 541.

Information pipeline 530 provides a timing correction function to adjust for delays in transition indicator 540. The D input of third D flip flop 531 is coupled to the Q output of second D flip flop 521. The Q output of third D flip flop 531 is coupled to early/late indication circuit 550. The clock input of third D flip 531 is coupled to the 0 degree clock reference signal through node 593C. Third D flip flop 531 toggles the relevant transition through to its outputs at the same time as the positive going 0 degree clock reference signal transition that toggles the relevant transition through fifth D flip flop 542 and sixth D flip flop 544. As a result of the synchronizing the propagation of a relevant transition through transition indication circuit 540 and information pipeline circuit 530, all the relevant transition information is fed to early/late indication circuit 550 at the same time.

Early/late indication circuit 550 of FIG. 5B indicates if the detected phase shift in the transition of the data signal was towards an early data transition time or a late data transition time. First AND gate 551 indicates if there has been an early transition to a logical 1. One input to first AND gate 551 is coupled to the Q output of third D flip flop 531 and another input to AND gate 551 is coupled to the Q output of fifth D flip flop 542. Second AND gate 552 indicates if there has been an early transition to a logical 0. One input to second AND gate 552 is coupled to the inverse Q output of third D flip flop 531 and another input of AND gate 552 is coupled to the inverse Q output of fifth D flip flop 542. Third AND gate 553 indicates if there has been a late transition to a logical 1. One input to third AND gate 553 is coupled to the inverse of Q output of third D flip flop 531 and the other input to third AND gate 553 is coupled to the Q output of fifth D flip flop 542. Fourth AND gate 554 indicates if there has been a late transition to a logical 0. One input to fourth AND gate 554 is coupled to the Q output of third D flip flop 531 and the other input to AND gate 554 is coupled to the inverse Q output of fifth D flip flop 542. One input from each of first, second, third and fourth AND gates 551, 552, 553 and 554 respectively, are coupled to the Q output of sixth D flip flop 544.

The first and second OR gates of early/late indication circuit 550 code the information regarding the signal at data input port 501 by eliminating the polarity reference and just indicating if the signal is early or late. One input of first OR gate 555 is coupled to the output of first AND gate 551 and the other input to first OR gate 555 is coupled to the output of second AND gate 552. The output of first OR gate 555 indicates if the signal is early and is coupled to data early port 502. One input of second OR gate 556 is coupled to the output of third AND gate 553 and the other input to second OR gate 554 is coupled to the output of fourth AND gate 554. The output of second OR gate 556 indicates if the signal is late and is coupled data late port 503.

Figure 5C:
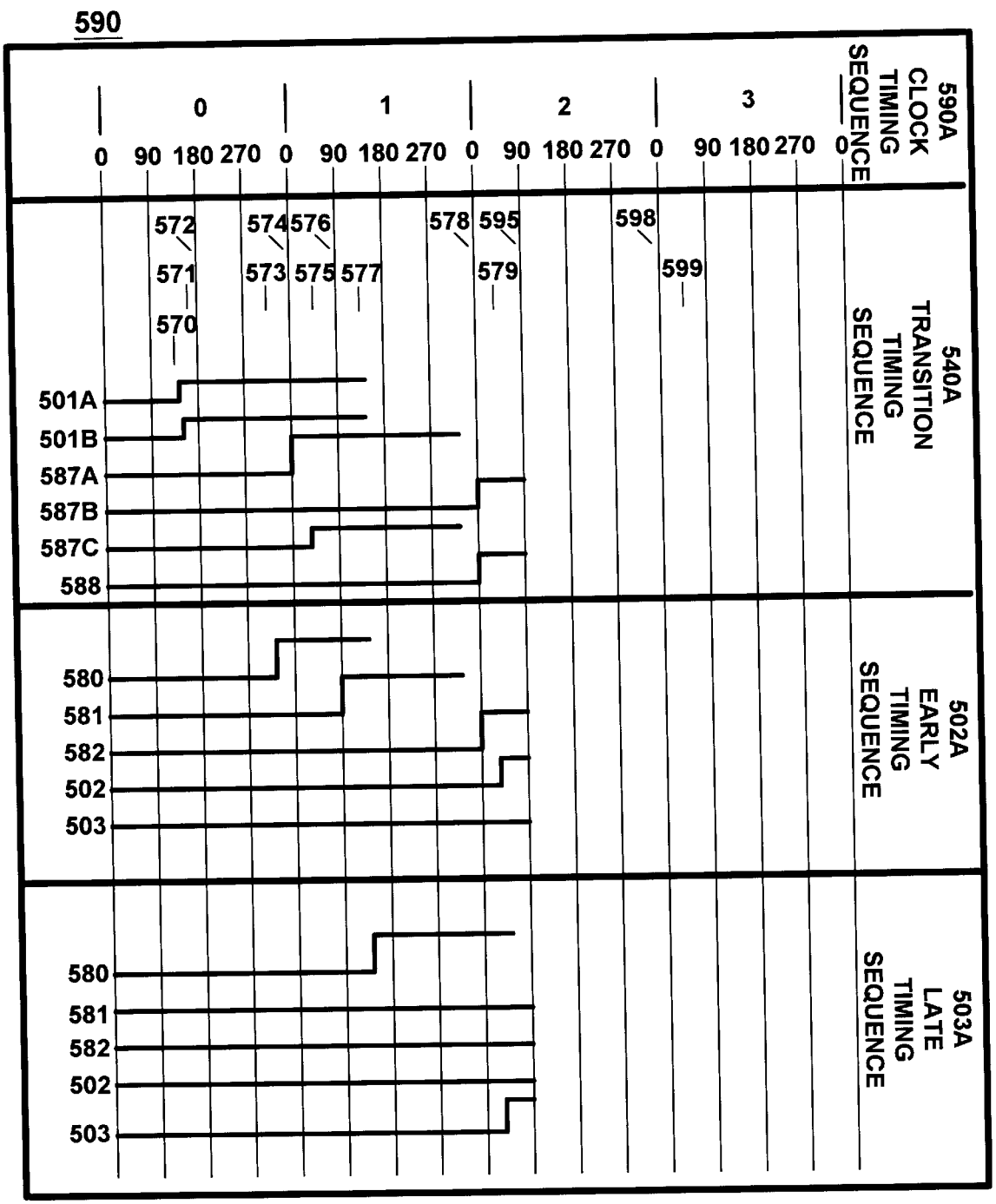
FIG. 5C is one embodiment of timing diagram 590 comparing the effects of a transition in a data input signal 501A applied to digital phase amplifier versus a data input signal 501 B that is out of phase with data input signal 501A.

FIG. 5C is one timing diagram 590 comparing the outputs of digital phase amplifier and detector system 500A when early data input signal 501A to data input port 501, versus a late data input signal 501 B that is out of phase with early data input signal 501 A. Timing diagram 590 includes four related timing sequences: clock timing sequence 590A; transition timing sequence 540A; early timing sequence 502A; and late timing sequence 503A. Clock timing sequence 590A shows the clocking scheme for digital phase amplifier and detector system 500A. Transition timing sequence 540A shows the timing sequence for transition detection circuit 540. Early timing sequence 502A shows the timing sequence for phase amplifier circuit 510, phase detection circuit 520, and information pipeline circuit 530 when a signal at data input port 501 transitions early. Late timing sequence 503A shows the timing sequence for phase amplifier circuit 510, phase detection circuit 520, and information pipeline circuit 530 when a signal at data input port 501 transitions late.

The time it takes for a signal to propagate through a normally operating flip flop is not distinguished in timing diagram 590 so as not to unnecessarily obscure the invention. The period required for a signal to be processed by a flip flop is very short and for the purposes of illustrating the present embodiment the output of a flip flop is considered to happen instantaneously with a transition of the clock signal that controls a particular flip flop. In other embodiments, the signal propagation time through a flip flop are reflected in the timing diagrams. The delays in propagation through a flip flop operating in the metastable region are illustrated in timing diagram 590.

In FIG. 5C, clock timing sequence 590A illustrates the relationship of four clock signals that trigger various D flip flops of digital phase amplifier and detector system 500A. The four clock signals are a 0 degree reference clock signal, a 90 degree clock signal that is phase shifted 90 degrees from the 0 degree reference clock signal, a 180 degree clock signal that is phase shifted 180 degrees from the 0 degree reference clock signal, and a 270 degree clock signal that is phase shifted 270 degrees from the 0 degree reference clock signal. Other embodiments of digital phase amplifier and detector system 500A have clocks that transition at different phase shifts from one another. The initial logical states of digital phase amplifier and detector system 500A are at a logical 0.

Transition timing sequence 540A illustrates the logical values of signals at nodes in transition detection circuit 540 in response to either signal 501A or 501 B at data input node 501. The relevant transitions to a logical 1 in both signals 501A and 501B at time 570 and 571 respectively, have the same impact on transition detection circuit 540 since they are both sufficiently before the 0 clock reference signal transition at time 574. The relevant logical 1 at data input node is toggled through fourth D flip flop 541 at time 574 and the signal at node 587A goes to a logical 1. Also at time 574 the previous logical 0 at node 587A is toggled through fifth D flip flop 542 and the value at node 587B in this case remains at a logical 0. By time 575, the logical 1 at node 587A and the logical 0 at node 587B have been compared by XOR gate 543 and the output of a logical 1 indicating there has been a transition appears at node 587C. Sixth D flip flop 544 essentially acts as a skew adjuster and the logical 1 at node 587C is toggled through sixth D flip flop 544 at time 578 and appears at node 588. At time 578, fifth D flip flop 542 is also toggled and the relevant logical 1 is transmitted to point 587B.

Early timing sequence 502A shown in FIG. 5C illustrates the timing sequence the logical values of signals at nodes in phase amplifier circuit 510, phase detection circuit 520, and information pipeline circuit 530 when a signal at data input port 501 transitions early. The transition to a logical 1 in data signal 501A at time 570 is in the metastable region of first D flip flop 511 which is triggered at time 572. Since first D flip flop 511 is operating in the metastable region, there is a delay and the transition to a logical 1 does not toggle all the way through first D flip flop 511 until time 573, at which time node 580 goes to a logical 1. Node 580 going to a logical 1 at time 573 effectively presents a logical 1 to the input of second D flip flop 521 early enough to catch the next transition in the 90 degree clock signal at time 576. At time 576 the signal at node 581 goes to a logical 1 and is presented to third D flip flop 531. At time 578 the third clock signal (0 degree reference clock signal) triggers third D flip flop 531 and a logical 1 value is transmitted to node 582. Thus at time 578, nodes 582, 587B and 588 all have a logical 1 value and the early/late detection circuit 550 produces a logical 1 value at data early node 502 and a logical 0 value at data late node 503 at time 579.

Late timing sequence 503A of FIG. 5C illustrates the timing sequence the logical values of signals at nodes in phase amplifier circuit 510, phase detection circuit 520, and information pipeline circuit 530 when a signal at data input port 501 transitions late. The transition to a logical 1 in the data signal 501B at time 571 is still in the metastable region of first D flip flop 511. Since the transition in the data signal 501B at time 571 is later than the transition in data signal 501A at time 570, the delay through first D flip flop 511 is longer than in early timing sequence 502A. The transition to a logical 1 in late timing sequence 503A does not toggle all the way through first D flip flop 511 until time 577, at which time node 580 goes to a logical 1. Since Node 580 goes to a logical 1 at time 577, it does not present a logical 1 to the input of second D flip flop 521 early enough to catch the transition in the 90 degree clock signal at time 576. Thus, at time 578 the signal at node 582 is still at a logical 0 even though the signals at nodes 587B and 588 are a logical 1. the result of presenting these values to early/late detection circuit is that at time 579 the signal at data late node 503 transitions to a logical 1 indicating the transition in data signal 501B was late.

Digital phase amplifier and detector system 500A can process more than one transition per cell. If this happens, the transition detect circuit assumes no transitions during the cell and blocks early/late detection.

If the present relevant transition is early, its polarity is the same at node 582 as it is at node 587B. This results in early/late detection circuit 550 producing a logical 1 value at data early node 502 and a logical 0 value at data late node 503 at time 595. If the present relevant transition is late, its polarity at node 582 will be opposite node 587B. This results in early/late detection circuit 550 producing a logical 0 value at data early node 502 and a logical 1 value at data late node 503 at time 599, correctly indicating that the transition at data node was late. If there is no transition, then node 588 is a logical 0 and both data early node 502 and data late node 503 are logical 0.

Figure 6:
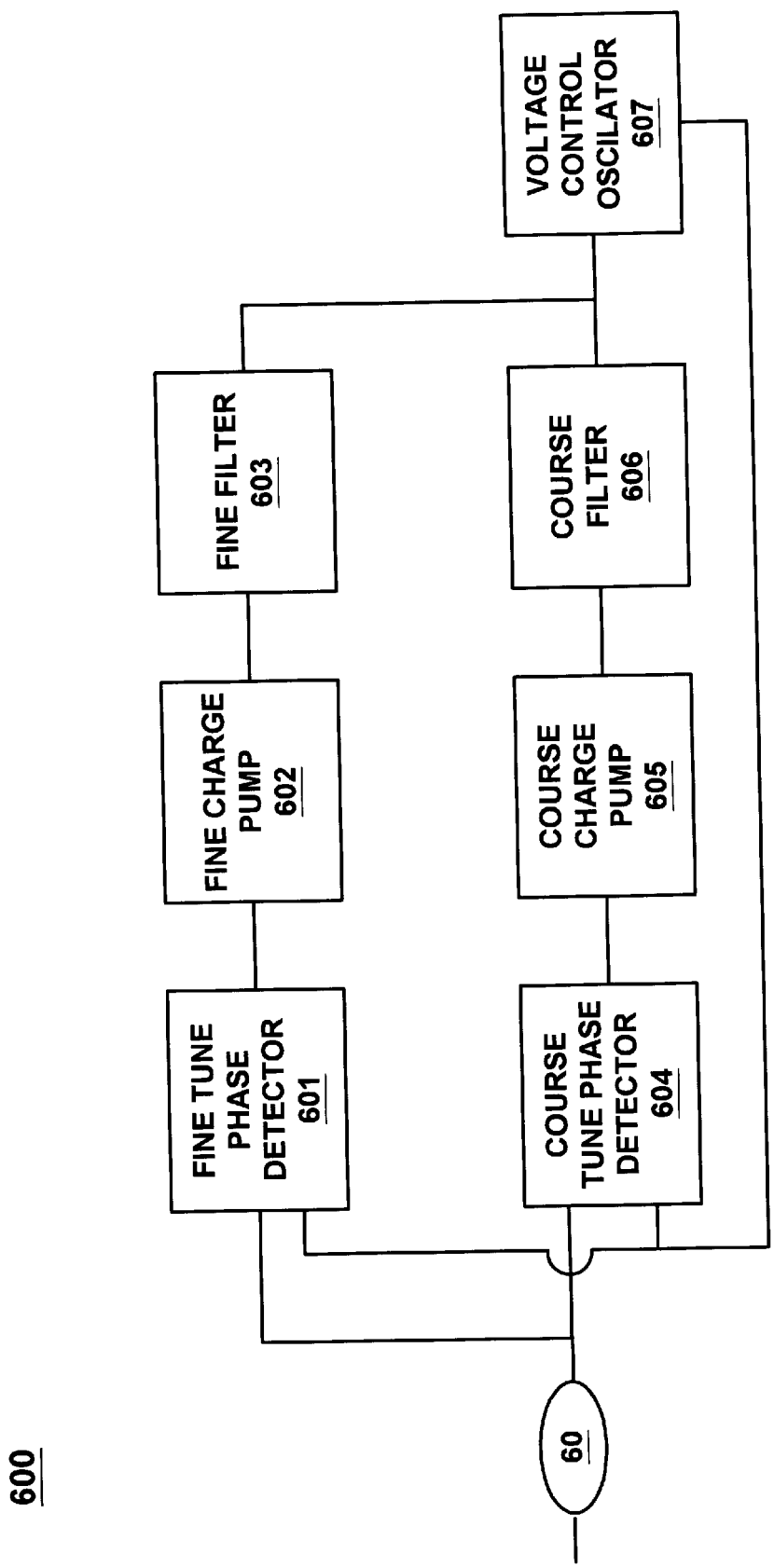
FIG. 6 is a block diagram showing an example of an application of one embodiment of the present invention as a phase amplifier and detector in a phase lock loop system 600.

FIG. 6 illustrates an example of one embodiment of the present invention used as a phase amplifier and detector in a phase lock loop system 600. In this particular embodiment, the phase amplifier and detector is utilized to fine tune the phase lock loop by resolving very small time differences in phase shifts the primary phase lock loop can not detect. The phase lock loop system 600 comprises a port 60, a fine tune phase detector 601, a fine charge pump 602, a fine filter 603, a course tune phase detector 604, a course charge pump 605, a course filter 606 and a voltage controlled oscillator 607.

Port 60 is coupled to a fine tune phase detector 601 and course tune phase detector 604. Course tune phase detector 604, is coupled to course charge pump 605 which is coupled to course filter 606. Fine tune phase detector 601 is coupled to fine charge pump 602 which is coupled to fine filter 603. Voltage control oscillator 607 is coupled to fine filter 603, course filter 606, fine tune phase detector 601 and course tune phase detector 604.

Course tune phase detector 604 provides a course tuning of a signal at port 60. Any course adjustment that is required due to course error terms is fed into course charge pump 605 which drives a higher or lower current into the filter to cancel course error terms. Course filter 606 filters out any sum signals and just passes a signal indicating a shift in the signal at port 60. Voltage control oscillator 607 utilizes the information from course filter 606 to introduce appropriate course adjustments to the signal at port 60.

Fine tune phase detector 601 provides a fine tuning of a signal at port 60. Fine tune phase detector 601 includes an embodiment of a phase shift amplifier and detection system and method of the present invention. This provides fine tune phase detector 601 the ability to resolve very small times required in fine tuning the signal at port 60. Fine tuning adjustments that are required due to fine error terms is fed into fine charge pump 602 which drives a higher or lower current into the filter to cancel fine error terms. Fine filter 603 filters out any sum signals and just passes a signal indicating a shift in the signal at port 60. Voltage control oscillator 607 utilizes the information from fine filter 606 to introduce appropriate fine adjustments to the signal at port 60.

In one application, phase lock loop system 600 utilizes one embodiment of a digital phase shift amplification and detection system and method to facilitate clock recovery. Two matching characteristic variable delay lines are used as phase lock loops. One of the variable delay lines functions as the voltage controlled oscillator needed for extraction of the baseline timing used in the encoding/decoding of the non return to zero (NRZ) data pattern. The second delay line is used to allow the extraction of phase information from the variable transition rate input data stream.

FIG. 7 is a flow chart of one embodiment of an phase shift amplifying and detection method 700. The steps of phase shift amplifying and detection method 700 are basically divided into the functions of amplifying a phase shift in a signal by applying it to a metastable flip flop and detecting delays in the output by utilizing a second flip flop triggered by a clock signal that is out of phase with the clock signal that triggers the first flip flop. These functions permit phase shift amplifying and detection method 700 to resolve small periods of time.

In step 701, a signal is applied to the input of a first flip flop operated in the metastable region. The first flip flop is coupled to a first clock signal. In one embodiment the signal applied to the input of the first flop is adjusted so that it transitions at a time relative to the first clock signal such that the first flip flop operates in its metastable region. In another embodiment, the first clock signal is adjusted to transition at a time relative to the signal applied to the input of the first flip flop such that the first flip flop operates in its metastable region.

The output of the first flip flop is transmitted in step 702, to a second flip flop that is triggered by a second clock signal that is out of phase with the first clock signal. In one embodiment, the relative position of the second clock signal to first clock signal in effect determines a nominal position to which other signals are compared. As the second clock signal lags farther behind the first clock signal it is more likely that the nominal time will be farther (later) into the metastable region.

In step 703, the relative position in the metastable region of the signal applied to the first flip flop in step 701 is determined. One embodiment of the present invention establishes if a signal applied to the first flip flop is earlier or later than a nominal time. It does this by comparing the outputs of a second flip flop with transition time of a second clock signal that triggers the second flip flop. A transition in the signal applied to the first flip flop that produces an output before a specific cycle in the second clock is considered early. A transition in the signal applied to the first flip flop that produces an output after a specific cycle in the second clock is considered late.

Step 704 establishes if a transition occurred in the signal applied to the first flip flop in step 701 above. In one embodiment of the present method the value of the signal applied to the first flip flop at the present time is compared with the value of the signal at an earlier time. If the values are different a transition occurred. If the values are the same a transition did not occur. In step 705 an indication of the logical value of the signal applied to the first flip flop is made.

There are a number of applications that can utilize variations on the phase shift amplifying and detection method 700. For example in one embodiment, an addition step is added to utilize the early or late status indication to keep the transitions in a signal being analyzed focused about a point in the metastable region. In another example, a step is added to process the information on the early or late status of a signal applied to the first flip flop and utilize it to fine tune a phase locked loop.

In another embodiment, an additional step provides an indication if a transition applied to the first flip flop occurs at a nominal time in the metastable region or within a range that is so small that it is considered to occur at a nominal time. The output of the first flip flop is sent to a second and a third flip flop which are triggered by second and third clock signals. First, second and third clock signals are all out of phase with each other. The second clock signal leads the third clock signal by slight phase shift and the first clock signal does not have a positive going transition between a positive going transition of the second clock signal and a positive going transition of the third clock signal. A signal that transitions at a nominal time generates an output that causes the second flip flop to indicate that it is late and the third flip flop to indicate that it is early. There is additional combinational logic that utilizes this information to indicate signal transitions within at a nominal time.

The present invention is a digital system that is able to resolve very small time differences in a signal or between two different signals, such as those that occur in very small phase shifts. It can be utilized as a phase amplifier that amplifies a relatively small input phase change to a relatively larger output phase shift. In addition the present invention can detect the difference in signal timing including small phase shifts. The present invention also exhibits other quasi analog characteristics and advantageously utilizes such quasi analog characteristics.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A phase shift amplification and detection system comprising:

a phase shift amplifier comprising a first flip flop operated in its metastable region wherein a phase shift in an input signal to said first flip flop generates a resulting phase shift in an output of said first flip flop, and said phase shift amplifier, in orders of magnitude greater than said phase shift in said input signal;

a detection circuit for detecting timing delays in said output of said phase shift amplifier, said detection circuit coupled to said phase shift amplifier; and a first clock signal and a second clock signal that are out of phase, wherein said first clock signal is coupled to said phase shift amplifier, said first clock signal is for triggering a transition in said phase shift amplifier and said second clock signal is coupled to said detection circuit, said second clock signal is for trigging a transition in said detection circuit.

2. The phase shift amplification and detection system of claim 1 wherein said detection circuit designates as early a signal that causes said phase shift amplifier to produce an output that transitions before a transition in said second clock signal triggers said detection circuit and said detection circuit designates as late a signal that causes said phase shift amplifier to produce an output that transitions after a transition in said second clock signal triggers said detection circuit.

3. The phase shift amplification and detection system of claim 1 wherein said detection circuit comprises a second flip flop coupled to said second clock signal.

4. The phase shift amplification and detection system of claim 3 wherein said detection circuit further comprises additional flip flops for providing increased information on the relative position of phase shifts in a signal that is applied to said input of said first flip flop, each of said additional flip flops is coupled to a respective additional clock signal and said output of said first flip flop, wherein each of said respective additional clock signals is out of phase with said first clock signal and said second clock signal and others of said respective additional clock signals.

5. The phase shift amplification and detection system of claim 4 wherein said first flip flop, said second flip flop and each of said respective additional flip flops are D flip flops.

6. The phase shift amplification and detection system of claim 4 wherein:

said detection circuit designates as early a signal that causes said phase shift amplifier to produce an output that transitions before a transition in said second clock signal and a third clock signal;

said detection circuit designates as occurring at a nominal time a signal that causes said phase shift amplifier to produce an output that transitions after a transition in said second clock signal but before a transition in said third clock signal; and said detection circuit designates as late a signal that causes said phase shift amplifier to produce an output that transitions after a transition in said second clock signal and said third clock signal.

7. The phase shift amplification and detection system of claim 1 wherein an output of said detection circuit is for maintaining the operation of said first flip flop in said metastable region.

8. The phase shift amplification and detection system of claim 1 wherein an output of said detection circuit is for resolving a small amount of time in the range of one hundred picoseconds to one picosecond in said phase shift of said input signal.

9. A phase shift amplification and detection system comprising:

a phase shift amplifier comprising a first flip flop operated in its metastable region;

a phase detection circuit comprising a second flip flop for detecting timing delays in an output signal of said phase shift amplifier;

a transition indication circuit for detecting a transition in an input signal to said phase shift amplifier, said transition detection circuit coupled to an input of said phase shift amplifier;

an information pipeline circuit for compensating for timing skews caused by said transition indication circuit, said information pipeline circuit coupled to said phase detection circuit; and a first clock signal, a second clock signal and a third clock signal that are out of phase, wherein said first clock signal is coupled to said phase shift amplifier and is for triggering a transition in said phase shift amplifier, and said second clock signal is coupled to said detection circuit and is for triggering a transition in said detection circuit, and said third clock signal is coupled to said transition indication circuit and information pipeline circuit and is for triggering a transition in said transition indication circuit and information pipeline circuit.

10. The phase shift amplification and detection system of claim 9 further comprising an early/late indication circuit for providing an indication of a signal applied to said input of said phase shift amplifier as being early or late with respect to a nominal time.

11. The phase shift amplification and detection system of claim 10 wherein said information pipeline circuit comprises a third flip flop triggered by said third clock signal that is out of phase with said first clock signal and said second clock signal, an input of said third flip flop is coupled to an output of said phase detection circuit.

12. The phase shift amplification and detection system of claim 11 wherein said transition indication circuit comprises:

a fourth flip flop for toggling said input signal to said phase shift amplifier responsive to being triggered by said third clock signal that is out of phase with both said first clock signal and said second clock signal, wherein said fourth flip flop is coupled to receive said third clock signal and said input signal to said phase shift amplifier;

a fifth flip flop for toggling an output signal of said fourth flip flop responsive to being triggered by said third clock signal, said fifth flip flop coupled to said fourth flip flop and said third clock signal;

an exclusive OR gate for comparing said output signal of said fourth flip flop and an output signal of said fifth flip flop to determine for logical equivalence wherein one input of said exclusive OR gate is coupled to an output of said fourth flip flop and the other input of said exclusive OR gate is coupled to an output of said fifth flip flop; and a sixth flip flop for toggling an output signal of said exclusive OR gate wherein said sixth flip flop is coupled to said exclusive OR gate and said third clock signal.

13. The phase shift amplification and detection system of claim 12 wherein said early/late indication circuit comprises:

a first AND gate for indicating if said input signal applied to said input of said phase shift amplifier makes an early transition to a logical 1, said AND gate coupled to an output of said third flip flop, an output of said fifth flip flop and an output of said sixth flip flop;

a second AND gate for indicating if said input signal applied to said input of said phase shift amplifier makes an early transition to a logical 0, said second AND gate coupled to an inverse output of said third flip flop and an inverse output of said fifth flip flop and said output of said sixth flip flop;

a third AND gate for indicating if said input signal applied to said input of said phase shift amplifier makes a late transition to said logical 1, said third AND gate coupled to said inverse output of said third flip flop, said output of said fifth flip flop and said output of said sixth flip flop; and a fourth AND gate for indicating if said input signal applied to said input of said phase shift amplifier makes a late transition to said logical 0, said fourth AND gate is coupled to said output of said third flip flop, said inverse output of said fifth flip flop and said output of said sixth flip flop.

14. The phase shift amplification and detection system of claim 13 wherein said early/late indication circuit further comprises:

a first OR gate for indicating said input signal applied to said input of said phase shift amplifier makes said early transition regardless of whether it transitions to said logical 1 or logical 0, said first OR gate coupled to said first AND gate and said second AND gate; and a second OR gate for indicating said input signal applied to the input of said phase shift amplifier makes said late transition regardless of whether it transitions to said logical 1 or logical 0, said second OR gate coupled to said third AND gate and said fourth AND gate.

15. The phase shift amplification and detection system of claim 12 wherein an input to said phase shift amplification and detection system is for receiving a signal in a phase lock loop and an output of said phase shift amplification and detection system provides said phase lock loop with tuning information.

* * * * *